(12) United States Patent
Park et al.

(10) Patent No.: US 7,319,615 B1
(45) Date of Patent: Jan. 15, 2008

(54) RAMP GATE ERASE FOR DUAL BIT FLASH MEMORY

(75) Inventors: Sheung-Hee Park, Pleasanton, CA (US); Gwyn Jones, Sunnyvale, CA (US); Wing Leung, Palo Alto, CA (US); Edward Franklin Runnion, Santa Clara, CA (US); Ming-Sang Kwan, San Leandro, CA (US); Xuguang Wang, Sunnyvale, CA (US); Yi He, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/497,597

(22) Filed: Aug. 2, 2006

(51) Int. Cl.
*G11C 16/06* (2006.01)
(52) U.S. Cl. .......................... 365/185.22; 365/185.14; 365/185.33
(58) Field of Classification Search ........... 365/185.22, 365/185.14, 185.33, 185.29, 185.28, 185.19
See application file for complete search history.

(56) References Cited

U.S. PATENT DOCUMENTS

| 5,608,672 | A  | * | 3/1997  | Tang et al. ............... 365/185.3 |
| 6,031,766 | A  | * | 2/2000  | Chen et al. .............. 365/185.3 |
| 6,331,951 | B1 |   | 12/2001 | Bautista, Jr. et al. |
| 6,567,316 | B1 | * | 5/2003  | Ohba et al. .............. 365/185.3 |
| 6,934,194 | B2 | * | 8/2005  | Takahashi et al. ...... 365/185.29 |
| 6,944,061 | B2 | * | 9/2005  | Camerlenghi et al. . 365/185.29 |
| 6,992,938 | B1 | * | 1/2006  | Shubat et al. ............... 365/201 |
| 7,042,766 | B1 | * | 5/2006  | Wang et al. ........... 365/185.22 |
| 7,072,221 | B2 | * | 7/2006  | Wang .................... 365/185.22 |
| 7,113,431 | B1 | * | 9/2006  | Hamilton et al. ....... 365/185.29 |

* cited by examiner

*Primary Examiner*—Gene N. Auduong
(74) *Attorney, Agent, or Firm*—Eschweiler & Associates, LLC

(57) ABSTRACT

A method of erasing a block of flash memory cells by applying a ramped gate erase voltage to the block of memory cells. When an erase verify of the block of memory cells indicates that erasure has not been successfully completed another erase voltage with a greater absolute value than the initial erase voltage can be applied to the block of memory cells until erasure is complete.

15 Claims, 12 Drawing Sheets

ERASING FIRST BIT TO "1" UTILIZING A RAMP GATE ERASE

ERASING SECOND BIT TO "1" UTILIZING A RAMP GATE ERASE

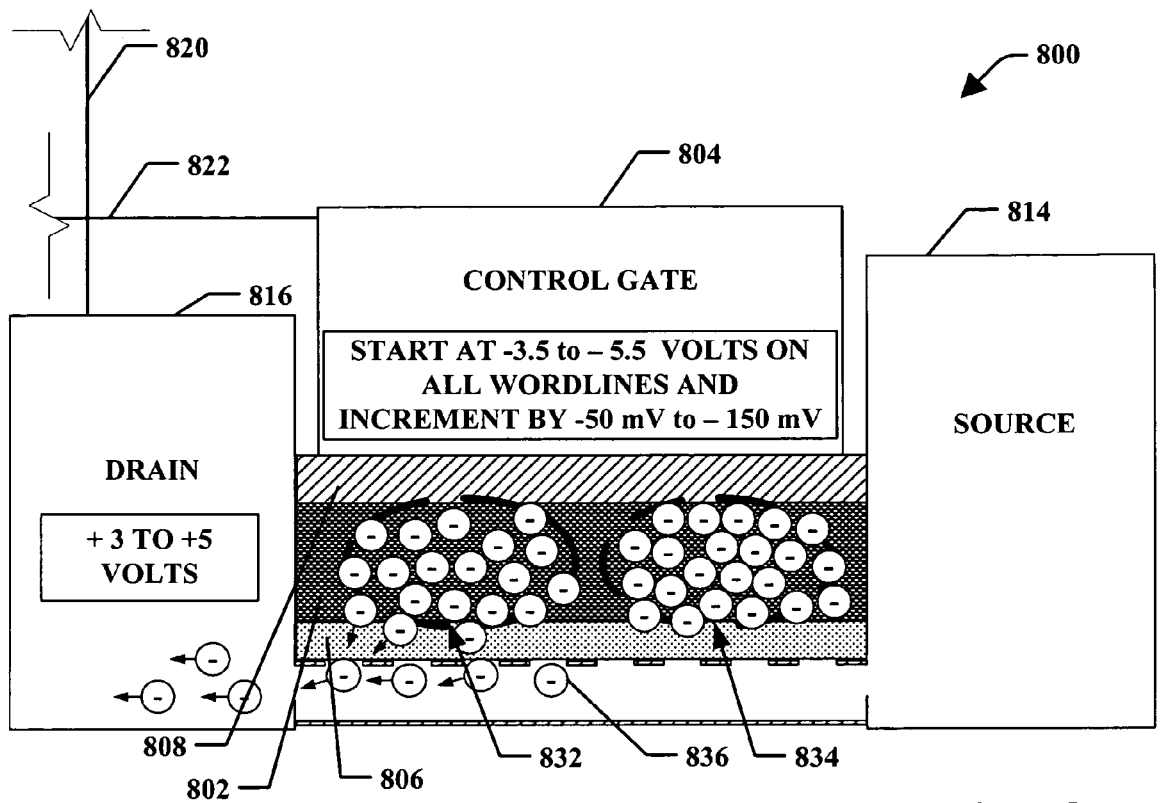
FIG. 8  ERASING FIRST BIT TO "1" UTILIZING A RAMP GATE ERASE
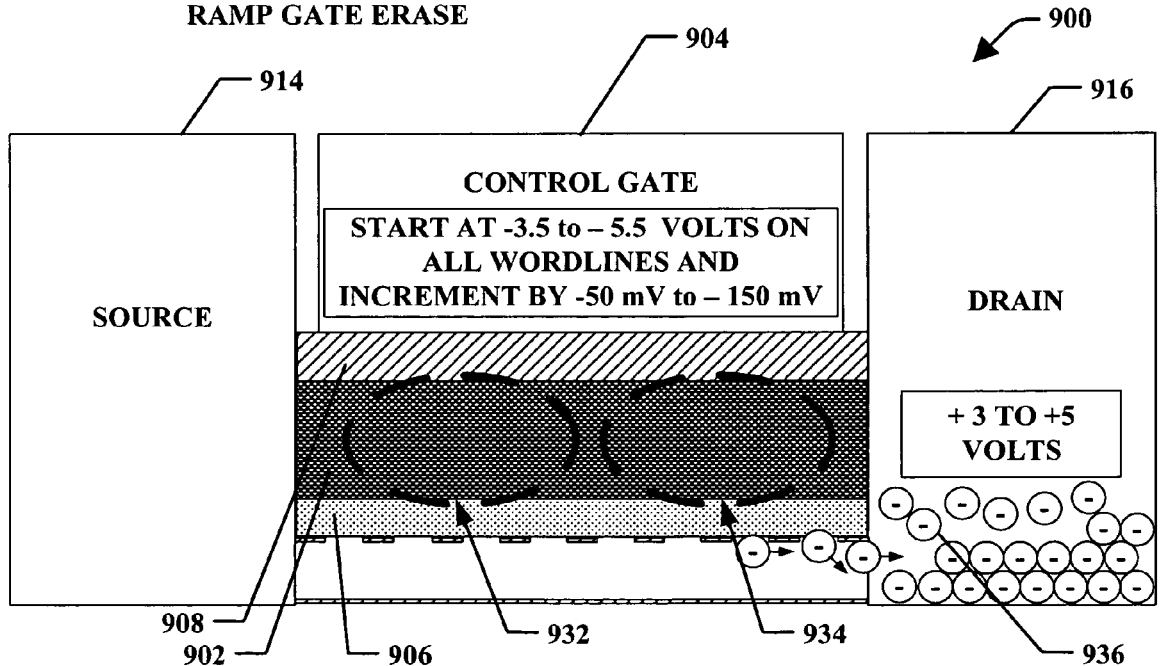
FIG. 9  ERASING SECOND BIT TO "1" UTILIZING A RAMP GATE ERASE

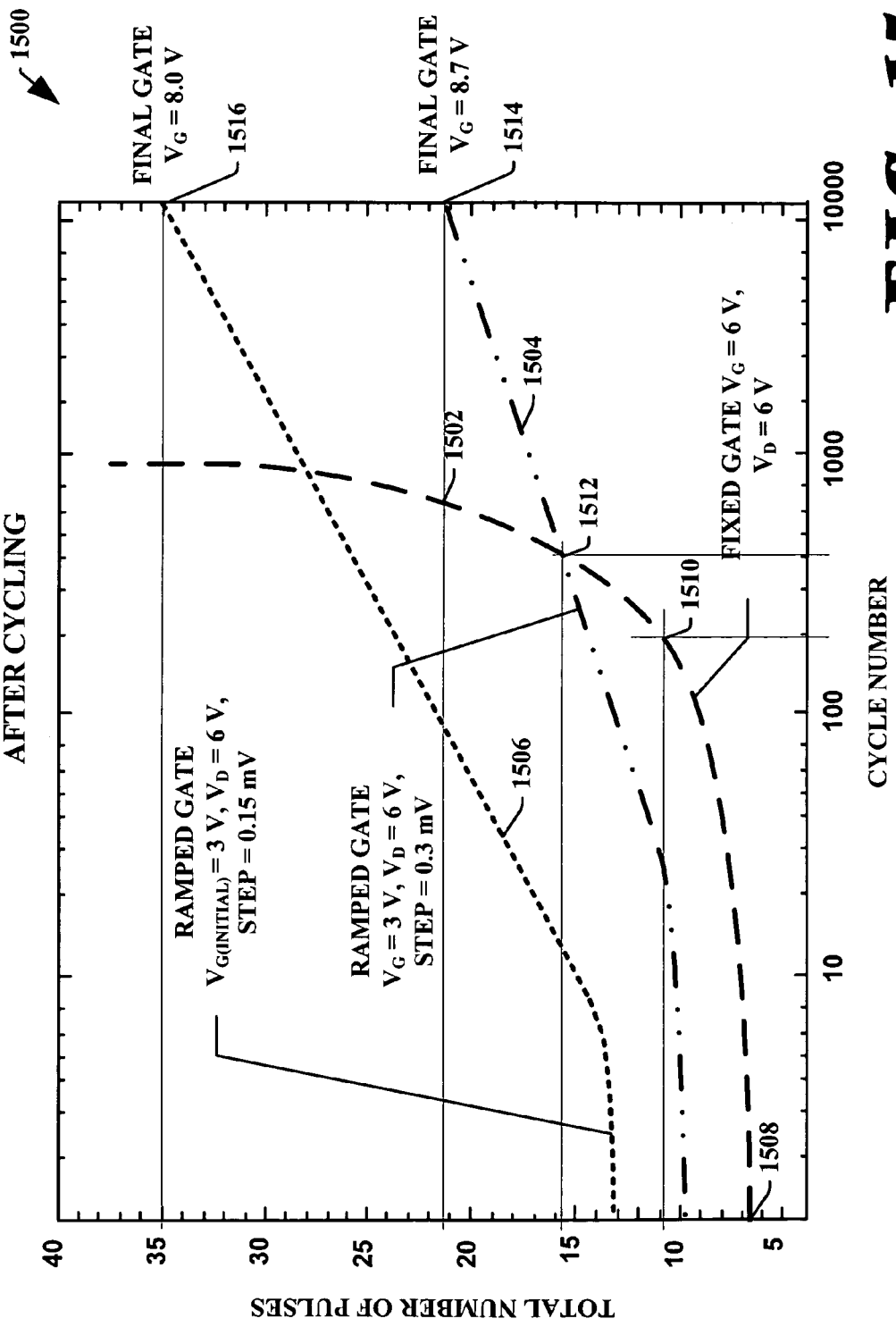

RAMP GATE ERASE FOR DUAL BIT FLASH MEMORY

FIELD OF INVENTION

The present invention relates generally to memory devices or systems, and in particular to methods of erasing flash memory utilizing a ramped voltage control gate.

BACKGROUND OF THE INVENTION

Various memory types and approaches exist to both program and erase data for computers, PDAs, digital cameras, telephone systems, flash drives, audio devices, video equipment, and the like. For example, random access memory (RAM), dynamic random access memory (DRAM), static random access memory (SRAM), read only memory (ROM), programmable read only memory (PROM), electrically erasable programmable read only memory (EEPROM), flash memory, and the like, are all presently available to provide data storage capability.

Each memory type has particular advantages and disadvantages associated with it. For example, DRAM and SRAM, both volatile memory, have the advantage of allowing individual bits of data to be erased, one at a time, but such data is lost when power is removed from the memory device. EEPROM, alternatively, can be erased but has reduced data storage density, lower speed, and higher cost than DRAM and SRAM. EPROM, in contrast to EEPROM, is less expensive and has greater packing density but is more difficult to erase.

Flash memory (non-volatile) was developed in the late 1980's, originating from EPROM (read only memory) and has become popular as it combines the advantages of the high packing density and the low cost of EPROM with the erasing ease of EEPROM. Flash memory is, for example, programmable, erasable, stores data in an array of floating gate transistors or cells, is re-writable and can hold its memory contents when power is removed from the device (nonvolatile memory). The charge level determines whether or not a flash memory cell turns "on" or "off" when a read voltage level is applied to a control gate of the cell. Flash memory is utilized in many portable electronic products, such as cell phones, laptop computers, voice recorders, MP3 players, cameras, PDAs, and the like, as well as in many large electronic systems, such as, planes, cars, locomotives, industrial control systems, etc. Flash memory is characteristically erasable and programmable in sectors of memory referred to as multi-bit blocks. A whole block of memory cells can be erased in a single action, or in a flash, which may have been how the device got its name. Programming is a technique for changing memory cell data from a logical "1" (erased state) to a logical "0" (programmed state) in a flash memory cell array. There are two schemes of programming flash memory, single-byte (word programming) and buffer programming. Some devices support, for example, the single byte/word method, or the buffer programming method, or both.

The erase, program, and read operations are commonly performed by application of appropriate voltages to certain terminals of the memory cell. In an erase or write operation the voltages are applied so as to cause a charge to be removed or stored on the floating gate within the memory cell, respectively. In a read operation, appropriate voltages are applied so as to cause a current to flow in the cell, wherein the determined amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

A traditional stacked gate memory cell generally has a source, a drain, and a substrate channel formed there between, as well as a stacked gate structure overlying the channel. The stacked gate may further include a thin gate dielectric layer (referred to as a tunnel oxide) formed on the surface of, for example, a P-well, silicon substrate. The stacked gate also includes a conductive, polysilicon floating gate overlying the tunnel oxide and an oxide dielectric isolation layer overlying the floating gate. The stacked gate structure is often a multilayer structure such as an oxide-nitride-oxide (ONO) layer having two oxide layers sandwiching a nitride layer and lastly, a polysilicon control gate overlies the isolation dielectric layer.

In a NOR architecture configuration, the control gate is connected to a wordline associated with a row of memory cells which together with other rows of cells form sectors of such memory cells. In addition, the drain regions of various cells are connected together by conductive bitlines. The channels of the various cells conduct current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash memory cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by a suitable mechanism, such as channel hot electron injection (CHE). Programming with CHE injection involves applying a relatively high voltage to the control gate and connecting the source to ground and the drain to a predetermined potential above the source but typically below the control gate voltage. When a resulting electric field is high enough, electrons collect enough energy to be injected from the source onto the floating gate. As a result of the trapped electrons, the threshold voltage of the cell increases, the voltage required to switch a MOSFET from a blocking state to a conducting state is increased. This change in the threshold voltage (and thereby the channel conductance) of the cell created by the trapped electrons is what causes the cell to be programmed.

In order to erase a typical single bit, stacked gate, flash memory cell, a relatively high voltage is applied to the source (e.g., +5 volts), and the control gate is held at a high negative potential (e.g., −10 volts), while the drain is allowed to float. Under these conditions, a strong electric field is developed across the tunnel oxide between the floating gate and the source. The electrons that are trapped in the floating gate flow are forced into the source region by way of Fowler-Nordheim tunneling through the tunnel oxide. As the electrons are removed from the floating gate, the cell is erased or set to "1".

For a read operation, a certain voltage bias is applied across the drain to source of the cell transistor. The drain of the cell is connected to a bitline, which may be connected to the drains of other cells in a byte or word group. A source read voltage is applied at the source and a drain read voltage (greater than the source read voltage) is applied at the drain. A read gate voltage is then applied to the control gate (e.g., by way of the wordline) of the memory cell transistor that is greater than the drain read voltage in order to cause a current to flow from the drain to source. The read operation gate voltage is typically applied at a level between a programmed threshold voltage (Vt) and an un-programmed threshold voltage. The resulting current is measured, by which a determination is made as to the data value stored in the cell.

Another type of flash memory is dual bit memory, which allows multiple bits of data or information to be stored in a single memory cell. In this technology, a memory cell is essentially split into two dual or complementary bits, each of which is formulated for storing one of two independent pieces of data. Each dual bit memory cell, like a traditional single bit cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the addressing of the two bits.

In virtual ground type architecture, dual bit memory cells are mounted on a semiconductor substrate with conductive bitlines (columns) formed therein. A multilayer "storage layer", referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines (rows) are formed over the charge-trapping dielectric layer generally perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

As with many aspects of the semiconductor industry, there is a continuing desire to scale down device dimensions to achieve higher device packing densities on semiconductor wafers. Similarly, increased device speed and performance are also desired to allow more data to be stored on smaller memory devices, and quicker access to that data, etc. Accordingly, there are ongoing efforts to, among other things, increase the number of memory cells that can be packed on a semiconductor wafer (or die).

One technique to pack more memory cells/transistors into a smaller area is to form the structures and component elements closer together. Forming bitlines closer together, for example, shortens the width of the transistor and the associated length of a channel defined there between and therefore allows more devices to be formed within the same area. This can, however, cause certain undesirable phenomena to become more prevalent. For example, isolating two bits or charges stored within a charge trapping layer becomes increasingly difficult as the channel length is decreased and the bits are brought closer together. In this manner, the charge on the bits can contaminate or disturb one another, causing operations performed on the bits to be more challenging and introducing a greater opportunity for error. This interdependency or affect that bits can have on one another is sometimes referred to as complementary bit disturb (CBD). Accordingly, it would be desirable to be able to operate on, and in particular, to program and erase complementary bits of data to and from a memory cell in a manner that mitigates the affects that the bits have on one another while improving the Vt distribution of the erased and programmed bit states. This can become even more vexing when memory cells are cycled as will be discussed infra.

Also, while flash memory offers a variety of benefits to the end user as discussed supra, employing flash memory also gives rise to several additional problems. Flash memory typically has a long programming and erasing time. The programming of a memory cell can often take milliseconds to reach a required charge level on the floating gate on the transistor. In addition, flash memory is often negatively impacted by over-erasing in that an excessive charge is removed from the floating gate of the memory cell. Corrective programming often has to be employed to mitigate the damage caused by over-erasing.

In view of the foregoing, a need exists for an improved method of increasing the speed of erasure, increasing the reliability of memory cell and sector erasure, decreasing the power consumed during erasing operation, and other factors to become apparent in this disclosure.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention, in one embodiment, is directed to a method that erases dual level flash memory bits by applying a ramp gate erase voltage to the memory cell in order to erase dual bits in the memory cells. The two data bits can contain three or more data levels or data states including a blank level or erased state and two or more programmed levels.

The present invention, in another embodiment, pertains to a ramping voltage control gate method that is applicable to cells having one or more physical bits per cell, and two or more programmed states per physical bit.

The present invention, in yet another embodiment, pertains to a method of providing a "ramp gate" technique for erasing to a low level, the un-programmed bits of adjacent bit-pairs of multi-level dual bit memory cells, which tend to have an interdependent effect on one another. The invention also pertains to multi-level dual bit (MLDB) memory cells comprising two (complementary) bits in a single physical memory cell, wherein each bit can be programmed to multiple levels. In accordance with the present invention, one exemplary implementation of an MLDB memory cell comprises two complementary bits in a single physical cell, wherein each bit utilizes four program levels (e.g., L1, L2, L3, and L4), the cell called a "quad-bit cell" (QBC). As discussed in connection with the complementary bit disturb, however, such complementary bit-pairs existing within close confines may have an affect on one another that tends to alter the effective Vt of the bits within the MLDB cells.

The present invention, in a further embodiment, is directed to a method for employing a ramped voltage gate erasure technique in accordance with the invention. The technique is used for erasing dual bit flash memory sectors in an efficient manner requiring less erasure pulses to erase a group of cells than the current art. In addition, the ramped voltage gate erasure technique utilizes less power than current techniques. The inventors recognized that applying a lower voltage erasure pulse initially (lower than the current art) and subsequently ramping and/or increasing the absolute value of the voltage of the erasure pulse that a memory sector could be erased with fewer erasure pulses, as contrasted to the current art process of applying a higher initial and fixed voltage erasure pulse.

A fundamental advantage of the ramped voltage gate erasure technique is that it can be used to erase the memory sectors with fewer pulses after the semiconductor device has been life cycled, for example. In one example, the voltage gate erasure technique was compared to a current art fixed gate voltage technique. The ramped gate technique, in one example, employs an initial gate voltage of negative three volts (−3 V), an initial drain voltage of six volts (6 V) and an incremental voltage of −0.3 volts. In contrast, the prior art fixed voltage gate erasure method employed a constant gate voltage of negative six volts (−6 V) and a constant drain voltage of six volts (+6 V). Based on tests and modeling, after ten thousand "ramped voltage gate" cycles, only twenty one or twenty two pulses were required to erase all of the memory cells in the memory sector. In contrast, the current art (fixed voltage gate technique) after approximately one thousand cycles (ten times (10×) less than the ramped voltage gate memory sector experienced) required an exponential number of pulses to fully erase the memory cell sector.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 8 is a schematic block diagram of an exemplary dual bit memory cell erasing a first bit by employing a ramped voltage on a control gate, according to yet another aspect of the present invention;

FIG. 9 is a schematic of an exemplary illustration of a dual bit memory cell erasing a complementary second bit according to yet another aspect of the present invention, utilizing a ramped gate voltage;

FIG. 15 is a graph of fixed gate and ramped gate erasure, according to yet another aspect of the present invention.

DETAILED DESCRIPTION OF THE INVENTION

Figure 1:
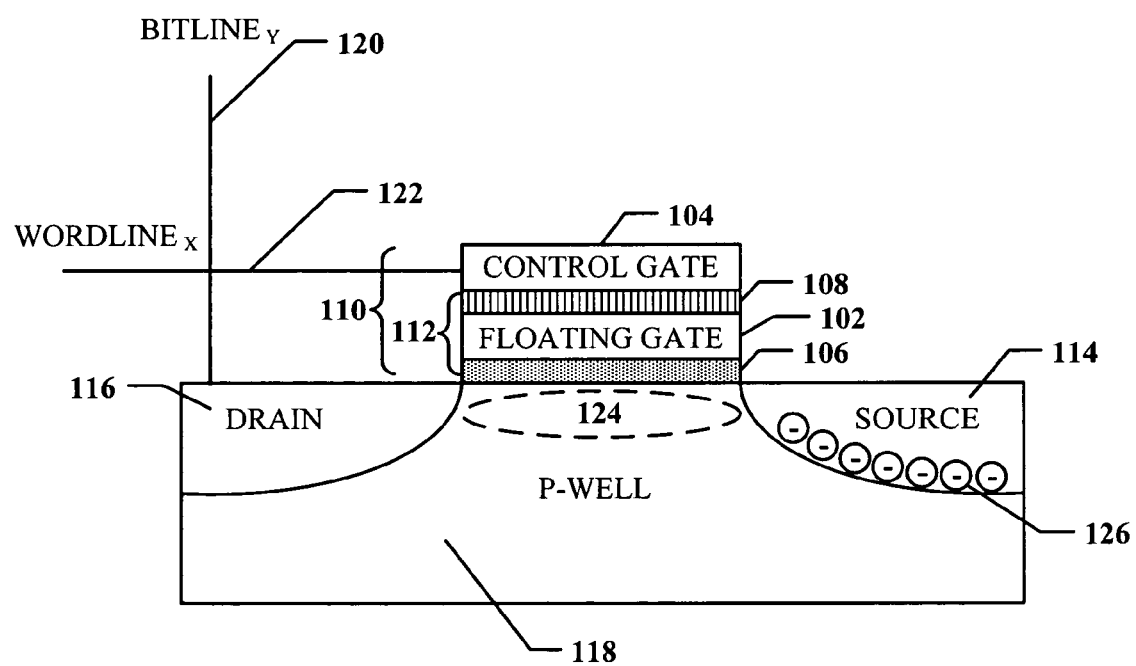
FIG. 1 is a cross-sectional view illustrating a single bit stacked gate flash memory cell according to one exemplary embodiment of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention, in a further embodiment, is directed to a method for employing a ramped voltage gate erasure technique in accordance with the invention. The technique is used for erasing dual bit flash memory sectors in an efficient manner requiring less erasure pulses to erase the block or sector of cells than the current art. In addition, the ramped voltage gate erasure technique utilizes less power than current techniques. The inventors recognized that applying a lower voltage erasure pulse initially (lower than the current art) and subsequently ramping and/or increasing the voltage erasure pulse that a memory sector could be erased with fewer erasure pulses, as contrasted to the current art process of applying a higher initial and fixed voltage erasure pulse.

A fundamental advantage of the ramped voltage gate erasure technique is that it can be used to erase the memory sectors with fewer pulses after the semiconductor device has been life cycled, for example. In one example, the voltage gate erasure technique was compared to a current art fixed gate voltage technique. The ramped gate technique employed an initial gate voltage of negative three volts (−3 V), an initial drain voltage of six volts (6 V) and an incremental voltage of −0.3 volts. Alternatively, the current art fixed voltage gate erasure method employs a constant gate voltage of negative six volts (−6 V) and a constant drain voltage of six volts (+6 V). After ten thousand "ramped voltage gate" cycles, only twenty one or twenty two pulses were required to erase all of the memory cells in the memory sector. In contrast, the current art (fixed voltage gate technique) after approximately one thousand cycles (ten times (10×) less than the ramped voltage gate memory sector experienced) required an exponential number of pulses to fully erase the memory cell sector.

Referring now to the figures, FIG. 1 is a cross sectional illustration of a stacked gate type flash memory cell 100 that may be employed in accordance with one aspect of the present invention. It is to be appreciated that although the explanation with respect to FIG. 1 is a single bit cell, with slight modification it can refer to a dual bit cell, to be discussed in detail infra. The memory cell 100 can be fabricated, for example, by employing semiconductor processes including hundreds of manufacturing steps to fabricate the flash memory cell 100 within a cell memory core and surrounded by layers of electrical interconnections, around the periphery. The flash memory cell 100 is constructed wherein data or information is stored within the flash memory cell 100 on a floating gate 102. The flash memory cells 100 can be constructed or layered on a semiconductor substrate 118 with a conducting bitline 120 (BITLINEY) attached to a drain 116. A conductive wordline 122 (WORDLINEX), associated with a row of such cells, is connected to a control gate 104 that is formed over a dielectric composite layer 112, and the WORDLINEX 122 is substantially perpendicular to a BITLINEY 120 in a typical NOR (logical NOT OR) type configuration. The conductive BITLINEY 120 connects the various drains in the column of cells including the cell 100 that can be referred to as CELLXY 100. The basic flash memory CELLXY 100 is similar to a metal oxide semiconductor field effect transistor (MOSFET) that has been adapted to incorporate the isolated inner floating gate 102 (e.g., made of polysilicon) between the external control gate 104 and a silicon substrate (P-well) 118. The inner floating gate 102 functions as the data-storing element of the flash memory cell 100. A stacked gate 110 includes the floating gate 102 sandwiched between the tunnel oxide dielectric 106 and an isolation or control dielectric 108 upon which the control gate 104 resides. In other words the floating gate 102 is entirely insulated all around by oxide and the oxide-nitride-oxide layer 112, thus formed, is often referred to as an "ONO layer". A substrate channel 124 formed between the source 114 and drain 116 regions conducts current between the source 114 and drain 116 in accordance with an electric field formed within the channel 124 by a voltage applied to the WORDLINEX 122 (attached to the control gate 104) and a voltage applied to the BITLINEY (attached to the drain 116). Typically, the source 114 terminal of each cell 100 is connected to a common source terminal. Any electrons placed on or within the floating gate 102 get "trapped" there, isolated by the surrounding oxide insulation, 106 and 108, and thus the floating gate 102 stores charge, indicative of words, data or information.

The floating gate 102 is typically comprised of a conductive material, for example, polysilicon and the like, and is typically deposited on the tunnel oxide 106. The tunnel oxide 106 is deposited on the substrate channel assembly 124 or the P-well/substrate 118 and is thin, so that the likelihood of electrons tunneling across or through it (from the semiconductor channel 124 to the floating gate 102) is high. The tunnel oxide 106 can be made of Si, SiO2, AlO and the like.

The programming circuitry controls one cell 100 by applying a first voltage to the wordline 122, which acts as the control gate 104 voltage, and a second voltage to the bitline 120 which acts as the drain 116 voltage. The basic flash memory cell 100 is, for example, like an NMOS transistor that has been modified with the "floating" gate 102. The writing aspect of NOR memory cell 100 programming, for example, takes place to obtain a "0" bit when a positive voltage is applied to both the bitline 120 (associated with the drain 116) and the wordline 122 (control gate 104) simultaneously, electrons 126 begin to flow from the source 114 region to the drain 116 region. As electrons flow from the source 114 to the drain 116, the large positive voltage placed on the control gate 104 provides an electrical field strong enough to draw electrons 126 through the tunnel oxide 106 and up into the floating gate 102, a process called channel hot-electron injection. The resultant high electric field across the tunnel oxide 106 results in a phenomenon called "Fowler-Nordheim" tunneling. During Fowler-Nordheim tunneling, electrons move from the source 116 into the channel region 124 and tunnel through the oxide layer 106 into the floating gate 102 and become trapped in the gate 102 since the floating gate is surrounded by oxide layers, 106 and 108. If the resultant negative charge on the floating gate 102 is above a selected threshold level, the bit is referred to as "programmed" and the cell is defined as a "zero".

The flash memory cell 100 can employ two states, for example, a "written" or "programmed" state ("0" state) and an "erased" state ("1" state), in order to store data or information. The charge level "trapped" within or on the floating gate 102 determines the flash cell 100 state by shifting the threshold voltage (Vt) of the control gate 104 that allows current to flow from the source 114 to the drain 116. The change in the threshold voltage (and associated channel 124 conductance) of the cell 100 produced by the trapped electrons 124, as discussed supra, results in the cell being "programmed". To erase (reset the cells to all 1's) a NOR flash cell 100, a large voltage differential is placed between the control gate 104 and source 114, which pulls the electrons off of the floating gate 102 through quantum tunneling. Most modern NOR flash memory components are made up of various "erase segments", usually called either "blocks" or "sectors". All of the memory cells 100 in a block are erased at the same time, however, NOR "programming" can generally be performed one byte or word at a time. An erased state "1" occurs when the charge of the floating layer or gate 102 does not influence the threshold voltage, or alternatively, a programmed state "0" is present when the charge level of the floating gate does sufficiently influence or change the threshold voltage of the control gate 104 beyond a predetermined level.

In single bit flash memory devices and systems, erase verification is performed to determine whether each cell in a block or set of cells has been appropriately erased. Present single bit erase confirmation methodologies and strategies afford verification of bit or cell erasure, and submission of additional erase pulses can be sent to individual cells that fail the verification process. Thereafter, the erased condition of the cell is again verified and the process continues until the cell or bit is successfully erased or the cell is "marked" as no longer viable.

However, one problem that occurs is that a large disparity or wide distribution of threshold voltages occurs after erasures have resulted in making the non-volatile semiconductor memory devices unstable, such that precise memory events of the devices are no longer possible. In addition, another problem is that a large erasure voltage required to erase a cell 100 can result in uncontrolled junction avalanche that changes erasure characteristics, which result in long term device reliability issues. The life span of flash memory is usually measured in terms of the number of erase cycles that can be completed. The number of cycles varies from device to device, but published ranges are from 10,000 to 1,000,000 erase cycles. Erasure voltages can often result in the decreased lifetime of a device. As with many aspects of the semiconductor industry, there is a continuing desire to increase the reliability of the devices while concurrently reducing the size of the devices.

Figure 2:
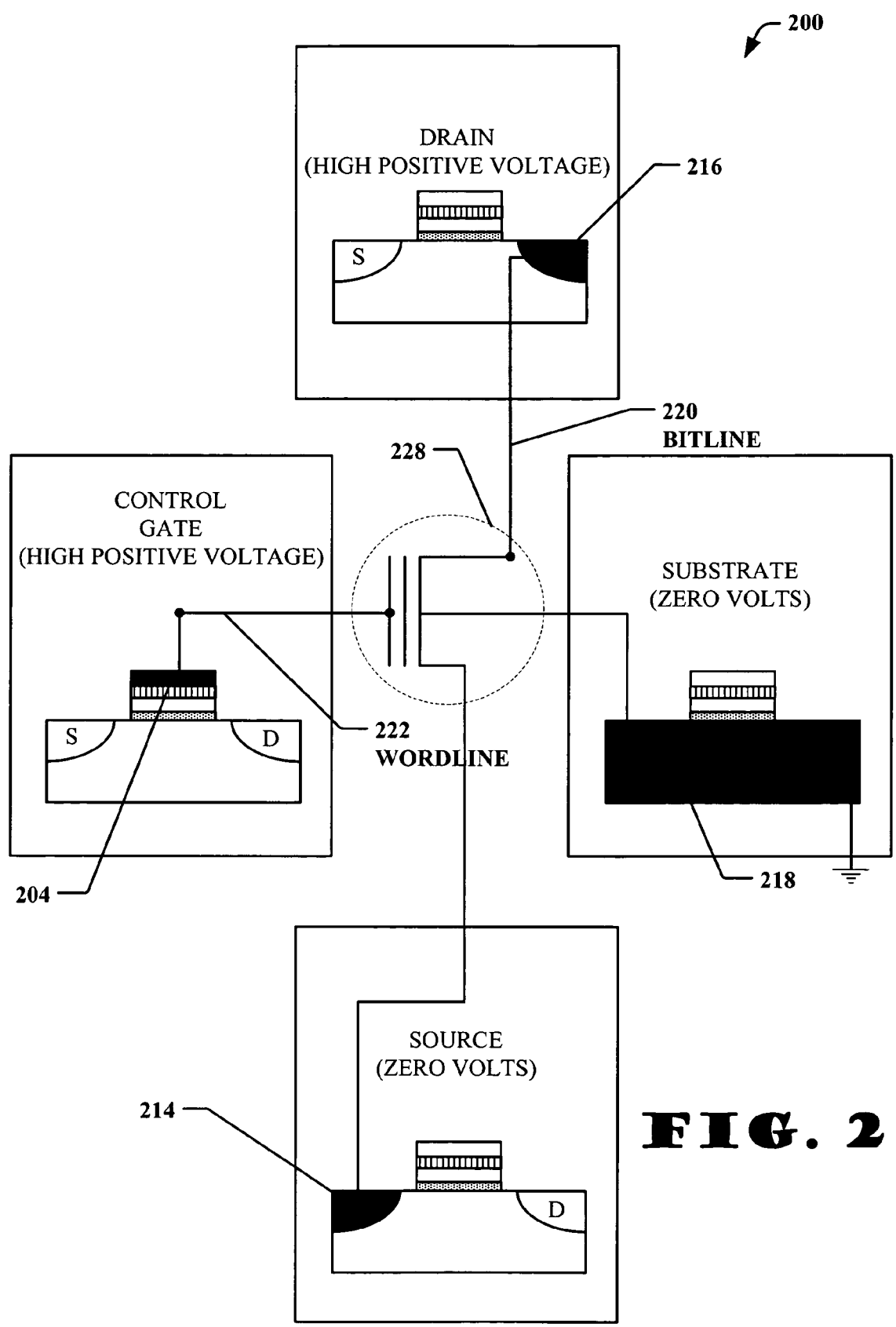
FIG. 2 is a schematic of a pictorial dual bit memory cell according to an exemplary aspect of the present invention.

Referring subsequently to FIG. 2, there is shown a schematic diagram of a known memory cell circuit along with its associated exemplary cell diagram 200. An exemplary cell 228 and memory circuit 200 may be a component of a much bigger memory array or multiple memory arrays. Various circuits may be employed in order to connect the exemplary cell 228 to other cell arrays. Initially the exemplary cell 228 is biased by applying a high voltage to a semiconductor drain 216 via a bitline 220, with a source 214 remaining at approximately zero volts. This results in the negative electrons flowing from the source 214 toward the drain 216, wherein the drain 216 voltage (VD) is, for example, approximately three to five volts. At approximately the same time a voltage of VG is applied to the control gate 214, approximately 6 volts, for example. The positive control gate 204 voltage causes some of the negative electrons to accelerate through the tunnel oxide and into the floating gate raising the negative potential of the floating gate and changing the threshold voltage. The floating gate "traps" or stores charges within its structure, which, can in turn, influence the "control behavior" of the control gate 204. Please note that the voltage levels provided in this discussion as well as other embodiments are merely provided as examples and are not intended to limit the invention.

Substrate 218 (shown as solid black) is also at zero potential as it is also connected to ground. The electrons flowing between the drain 216 and the source 214 define a region in the substrate called the current carrying channel. The biasable substrate 218 allows or facilitates charge flowing to the floating gate which in turn increases the field strength of the current carrying channel. Increasing the field strength decreases the barrier resistance of the tunnel oxide thereby making it easier for charges to overcome the tunneling resistance of the tunnel oxide. The stronger electric field also assists the current transmission in the current conducting channel permitting a reduction in the drain 216 voltage for flash memory operations, for example, programming, erasing, and the like.

Figure 3:
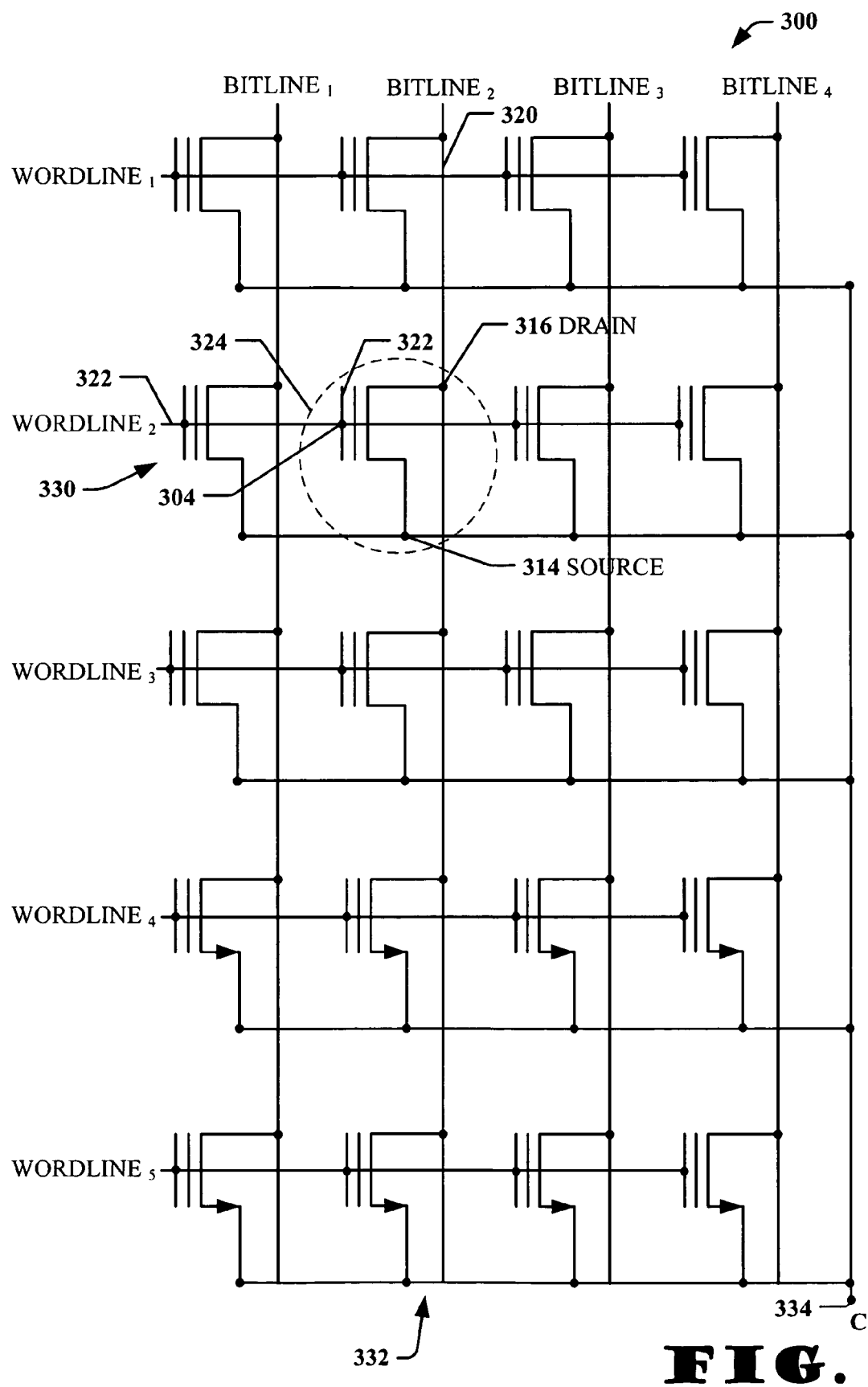
FIG. 3 is a schematic of an exemplary illustration of a partial sector array of wordlines and bitlines of flash memory cells in a NOR type architecture in accordance with one aspect of the present invention.

Referring now to FIG. 3, the figure illustrates a typical NOR configuration 300 of a partial array of flash memory cells, wherein with respect to, for example, an exemplary cell 324 (CELL2,2), a control gate 304 is connected to a wordline 322 (e.g., WORDLINE2, of WORDLINE1—WORDLINE5), wherein the wordline 322 is associated with a row 330 of such cells to form sectors of such cells. In addition, the drain regions of the cells are associated together by a conductive bitline 320 (e.g., BITLINE 2, of BITLINE 1—BITLINE 4). The channel of the cell conducts current between the source 314 and the drain 316 in accordance with an electric field developed in the channel by the stacked gate structure. In the NOR arrangement 300, each drain 316 terminal of the transistor 324 within a single column 332 of cells is coupled to the same bitline 320, e.g., BITLINE 2. In addition, each flash cell associated with a given bitline has its stacked gate terminal coupled to a different wordline (e.g., WORDLINE 1-WORDLINE 5), while all the flash cells in the array have their source terminals coupled to a common source terminal 334 (CS). In operation, individual flash cells are addressed via the respective bitline and wordline using, for example, a peripheral decoder and/or control circuitry for programming (writing), reading or erasing functions.

For example, a dual bit stacked gate flash memory cell 324 is programmed, for example, by applying a relatively high voltage to the control gate 304 and connecting the source 314 to ground and the drain 316 to a predetermined potential above the source 314. A resulting high electric field across the tunnel oxide leads to phenomena called "Fowler-Nordheim" tunneling that allows electrons in the core cell channel region to tunnel through the tunnel oxide into the floating gate and become trapped in the floating gate given that the floating gate is surrounded by the oxide dielectric and the tunnel oxide. As a result of the trapped electrons, the threshold voltage (Vt) of the cell 324 increases. This change in the threshold voltage (and thereby the channel conductance) of the cell 324 created by the trapped electrons is what causes the cell 324 to be programmed or set to "0".

In order to erase a typical dual bit stacked gate flash memory cell 324, a relatively high positive voltage is applied to the source 314, and the control gate 304 is held at a negative potential, while the drain 316 is allowed to float. Under these conditions, a strong electric field is developed across the tunnel oxide between the floating gate and the source 314. The electrons that are trapped in the floating gate, flow toward and cluster on the portion of the floating gate, overlying the tunnel oxide, and are extracted from the floating gate and into the source 314 region by way of Fowler-Nordheim tunneling through the tunnel oxide. As the electrons are removed from the floating gate, the cell 324 is erased or set to "1".

For read operations, a certain voltage bias is applied across the drain 316 to source 314 of the cell transistor 324. The drain 316 of the cell 324 is connected to the bitline 320, which may be connected to the drains 316 of other cells 324 in a byte or word group. The voltage at the drain 316 in conventional stacked gate memory cells is typically provided at between 0.5 and 1.0 volts in a read operation. A voltage is then applied to the control gate 304 (e.g., the wordline 322) of the memory cell transistor 324 in order to cause a current to flow from the source 314 to the drain 316. The read operation control gate 304 voltage is typically applied at a level between a programmed threshold voltage (Vt) and an un-programmed threshold voltage. The resulting current is measured, by which a determination is made as to the data value stored in the cell 324.

Figure 4:
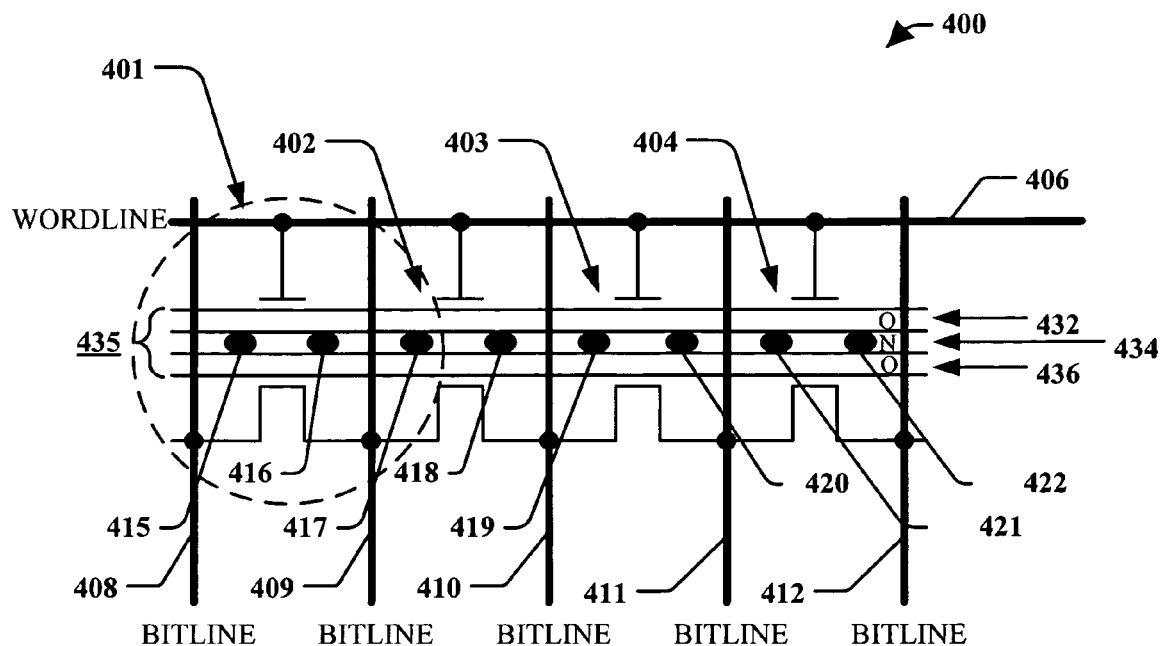
FIG. 4 is a schematic of a portion of a wordline and several associated bitlines in accordance with an aspect of the present invention illustrating as dual-bit type memory is a virtual ground type architecture.

Turning to FIG. 4, a schematic illustration is presented of a portion 400 of a memory core such as may include at least a portion of one of the M by N array cores that employs dual bit flash memory (which will be explained in detail infra). The circuit schematic shows a group of four memory cells 401 through 404 in a "virtual ground" type implementation, for example. The respective memory cells 401 through 404 are connected to a wordline 406, which serves as a control gate, and pairs of the memory cells share a common bitline. For instance, in the example shown, the memory cell 401 has associated bitlines 408 and 409; the memory cell 402 has associated bitlines 409 and 410; the memory cell 403 has associated bitlines 410 and 411; and the memory cell 404 has associated bitlines 411 and 412. As such, cells 401 and 402 share bitline 409, cells 402 and 403 share bitline 410 and cells 403 and 404 share bitline 411, respectively.

Depending upon wordline voltages and bitline connections, the memory cells 401 through 404 are capable of writing, reading, and erasing bits at locations 415 through 422. In addition to voltages applied to the wordline 406, control of the bit at location 415, for example, is achieved through connection of the drain to the bitline 408 and the source to the bitline 409. Similarly, control of the bit at location 416 is achieved through connection of the drain to the bitline 409 and the source to the bitline 408. Storage of multiple bits is made possible, at least in part, by a dielectric layer 434 interposed between the bitlines and the wordline. The dielectric layer 434 includes multiple insulating layers 432, 436 (e.g., oxide based material) that sandwich a charge trapping layer 434 (e.g., of nitride based material). Given its layer to layer composition, oxide-nitride-oxide, the dielectric layer 434 is often referred to as an ONO layer 435 in one example.

The ONO layer 435 allows the different bits to be stored at multiple states or levels as well. For example, depending upon the voltage applied to the memory cells 401 through 404 by the control gate or wordline 406 during programming, varying amounts of charge can be stored at locations 415 through 422. The different amounts of charge may correspond to different bit electrical states or levels, for example. If four different charge levels (e.g., 1, 2, 3 and 4) can be stored at each of the bit locations 415 through 422, for example, then each two-bit cell 401 through 404 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4).

Figure 5:
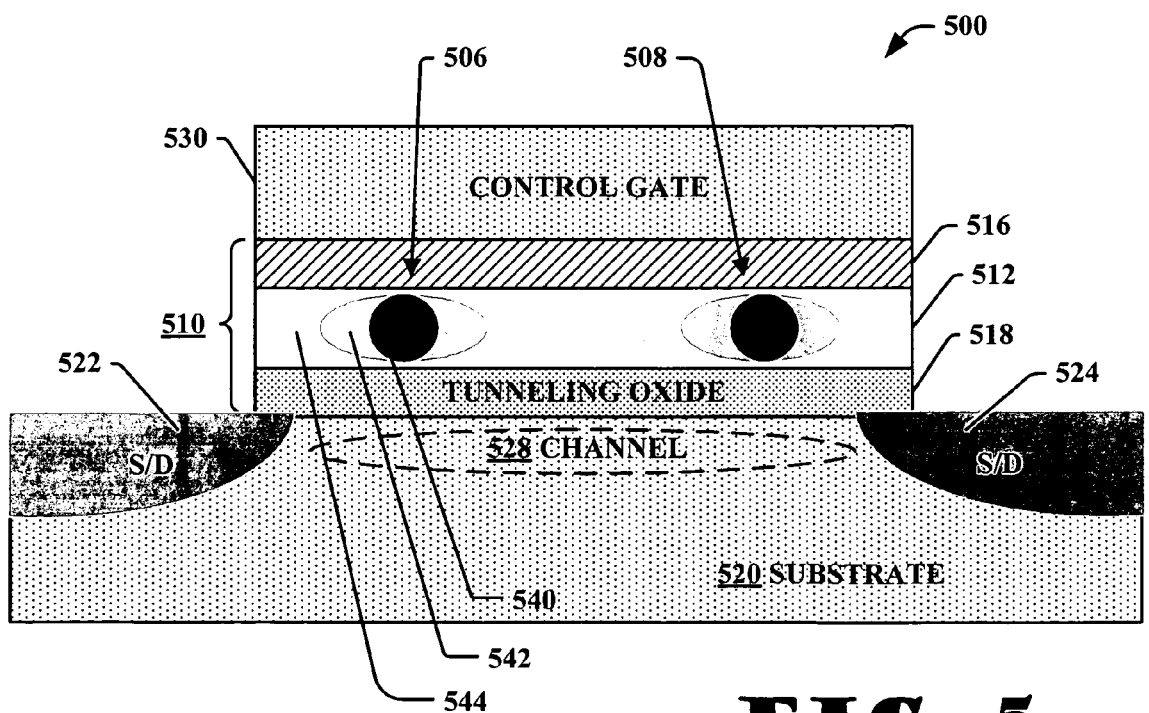
FIG. 5 is a cross-sectional view of a dual bit type flash memory cell wherein each of the bits can be potentially stored at multiple levels in accordance with an aspect of the present invention.

FIG. 5 is a cross sectional view of a dual bit memory cell 500 illustrating the capability of the cell to store varying degrees of charge at left and right dual bit locations 506, 508, according to an exemplary embodiment of the present invention. The dual bit flash memory cell 500 uses what is known in the art as "virtual ground" architecture in which the source of one bit (e.g., left bit) serves as the drain of the adjacent bit (e.g., right bit). During read operations the junction nearest the bit being read is the ground terminal (source) and the other side of the cell is the drain terminal (drain), this is called "reverse read". It will be appreciated that the memory cell 500 may, for example, correspond to the memory cells 401 through 404 depicted in FIG. 4. The cell 500 includes a dielectric layer 510 that comprises a charge trapping layer 512 sandwiched between two dielectric layers 516 and 518. The charge trapping layer 512 is formed from one or more substantially non-conductive substances, such as nitride based materials. The dielectric layers 516, 518 are similarly formed from one or more electrically insulating substances, such as oxide based materials. The layer to layer arrangement, for example, oxide, nitride, oxide layer of the dielectric layer 510 often leads it to be referred to as an ONO layer.

The charge trapping layer 510 is formed over a substrate 520 that may be formed from silicon or some other semiconductor material, for example. The substrate 520 may be selectively doped with a p-type dopant, such as boron, for example, to alter its electrical properties. In the example illustrated, the substrate 520 has buried bitlines or bitline diffusions including a first bitline diffusion 522 and a second bitline diffusion 524. The bitline diffusions 522 and 524 may, for example, be formed by an implanted n-type dopant, and may correspond to bitlines 408 through 412 in FIG. 4. A channel 528 is defined within the substrate between the first 522 and second 524 bitline diffusions (e.g., S/D extensions, deep S/D regions).

Overlying the upper dielectric layer 516 of the dielectric layer 512 is a gate 530 (control gate). This gate 530 may be formed from a polysilicon material, for example, and may be doped with an n-type impurity (e.g., phosphorus) to alter its electrical behavior. The gate may, for example, correspond to the wordline 406 in FIG. 4. The gate 530 enables a voltage to be applied to the cell 500 such that respective charges can, among other things, be stored within the cell at locations 506, 508, depending upon the electrical connections of the bitline diffusions 522, 524.

The dual bit memory cell 500 is generally symmetrical, thus the bitline diffusions 522 and 524 are interchangeable as acting source and drain. Thus, the first bitline diffusion 522 may serve as the source and the second bitline diffusion 524 as the drain with respect to right bit location 508. Likewise, the second bitline diffusion 524 may serve as the source and the first bitline diffusion 522 as the drain for the left bit location 506. The cell 500 can be programmed (set to "0") by applying a voltage across the gate 530 and an acting drain region, and connecting an acting source region to ground.

When programming the cell 500, the "acting" drain region 524 is typically biased to a potential above the "acting" source 522. As a result of the gate bias, a high electric field is applied across the charge trapping layer 512. Due to a phenomenon known as "carrier hot electron injection" (CHE), electrons pass from the acting source region 522 through the lower dielectric layer or tunneling oxide 518 and become trapped in the charge trapping layer 512 at locations 506 or 508. It will be appreciated that a second bit can be programmed to the alternate location 508 or 506 by reversing the acting source 522 and drain 524 and again applying a bias to the control gate 530.

By way of example, the left bit location 506 can be programmed by applying a program voltage to the gate 530 and a drain voltage to the second bitline 522, which is an acting drain for the left location 506. The first bitline 524, which is an acting source for programming the left bit location 506, can be, for example, connected to ground, left to float, biased to a different voltage level. The applied voltages generate a vertical electric field through the dielectric layers 518 and 516 and also through the charge trapping layer 512, and generate a lateral electric field across a length of the channel 528 from the first bitline diffusion 522 to the second bitline diffusion 524. At a given voltage, the channel 528 inverts such that electrons are drawn off the acting source 522 (the first bitline diffusion 524 in this example) and begin accelerating towards the acting drain 524 (the second bitline diffusion 522 in this example).

As the electrons move along the length of the channel 528, the electrons gain energy and, upon attaining enough energy, the electrons jump over the potential barrier of the bottom dielectric layer 518 and into the charge trapping layer 512, where the electrons become trapped. The probability of electrons jumping the potential barrier in this arrangement is a maximum in the area of the left bit location 506, adjacent the first bitline diffusion 522, where the electrons have gained the most energy. These accelerated electrons are termed hot electrons and, once injected into the charge trapping layer 512, stay in about the general area indicated for the left bit 506. The trapped electrons tend to remain generally localized due to the low conductivity of the charge trapping layer 512 and the low lateral electric field therein. Programming the right bit location 508 is similar, but the first bitline 524 operates as an acting drain and the second operates as an acting source 522.

For a read operation, a certain voltage bias is applied across an acting drain 524 to an acting source 522 of the cell 500. The acting drain of the cell is a bitline, which may be connected to the drains of other cells in a byte or word group. A voltage is then applied to the gate 530 (e.g., the wordline) of the memory cell 500 in order to cause a current to flow from the acting source 522 to the acting drain 524.

The resulting current is measured, by which a determination is made as to the value of the data stored in the cell. For example, if the current is above a certain threshold, the bit is deemed un-programmed or a logical "1", whereas if the current is below a certain threshold, the bit is deemed to be programmed or a logical "0". A second bit 508 can be read by reversing operations of the first and second bitline diffusions 522 and 524 for the acting drain and the acting source.

It can be appreciated that if the voltages utilized to program the left 506 and right 508 bit locations of the cell 500 are increased or sustained for longer periods of time, the number of electrons or amount of charge stored at these locations can be increased or otherwise varied. This allows the cell 500 to be utilized for additional data storage. For example, different amounts of charge can correspond to different programmed states. In the example illustrated, for instance, both the left 506 and right 508 bit locations can be said to have four different states or levels, namely 1, 2, 3 and 4, where level 1 corresponds to a situation where the locations are blank or un-programmed, and levels 2, 3 and 4 correspond to increased amounts of stored charge, respectively. With regard to the left bit location 506, for example, a level 2 may correspond to a relatively small amount of stored charge 540, while levels 3 and 4 may correspond to increasingly larger amounts of stored charge 542 and 544, respectively. This technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional flash memory cells. Thus, in the example above, a single dual-bit cell may store two physical bits of data at each of four Vt levels corresponding to four logical states.

Figure 6:
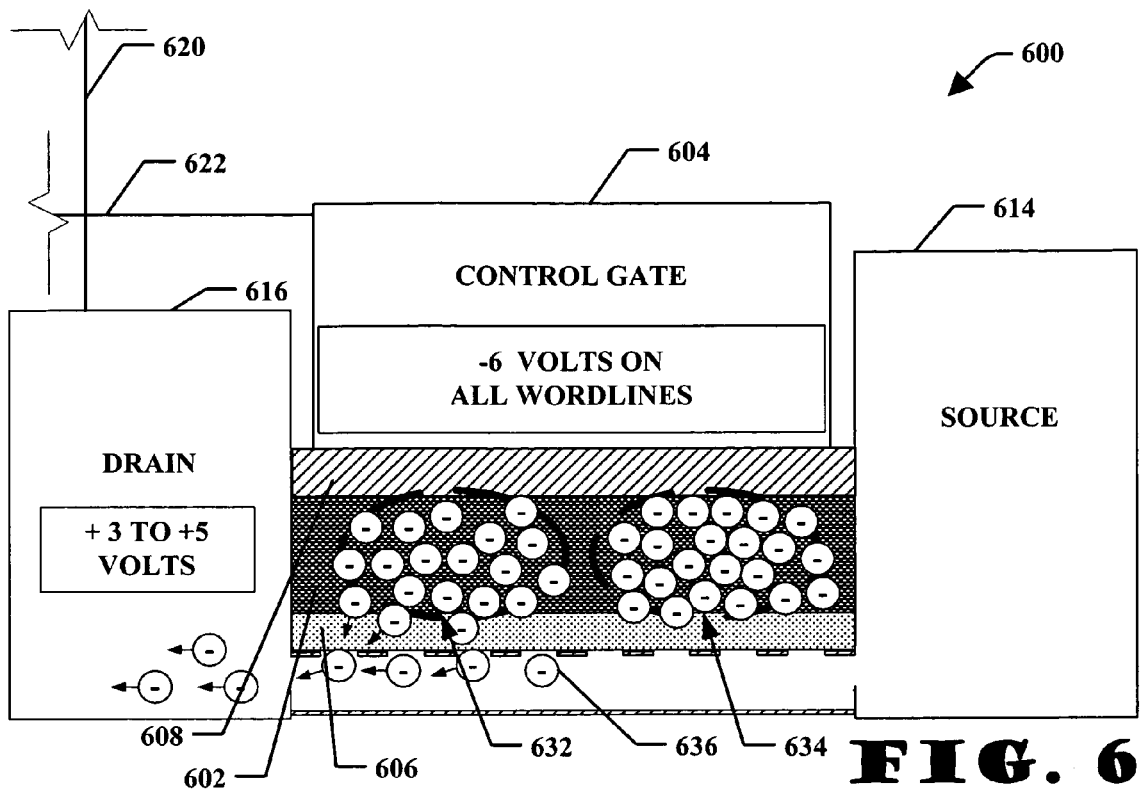
FIG. 6 is a schematic of a exemplary illustration of a prior art dual bit memory cell erasing a first bit.

The memory cell 600 of FIG. 6 of a conventional prior art system can be made up of a floating gate 602 (nitride layer) sandwiched between an isolation oxide layer 608 and a tunnel oxide layer 606. For example, a P-type substrate 628 has buried N+ source 614 and N+ drain 616 regions. The floating gate 602 is often referred to as a charge trapping layer. Overlying the isolation oxide layer 608 is, for example, a polysilicon control gate 604. The control gate 604 can be doped with an N-type impurity (e.g., polysilicon). The memory cell 600 is capable of storing two data bits, a left bit 632 and a right bit 634 represented by the dashed circles. The dual bit memory cell 600 is generally symmetrical, thus the drain 616 and the source 614 are interchangeable. Thus, the left junction may serve as the drain 616 terminal and the right junction as the source 614 terminal with respect to the left bit 632. Likewise, the right junction may serve as the drain terminal and the left junction as the source terminal for the right bit 634. The control gate 604 can be supplied, for example, with a negative six volts (−6 V) by applying the voltage to an associated wordline. The drain 614 is then supplied with a positive three to five volts (+3 to +5 V). The negative voltage on the control gate 604 repels the electrons on the floating gate 602 and the drain 614 positive voltage attracts electrons 636, wherein the first bit area 632 is erased.

Figure 7:
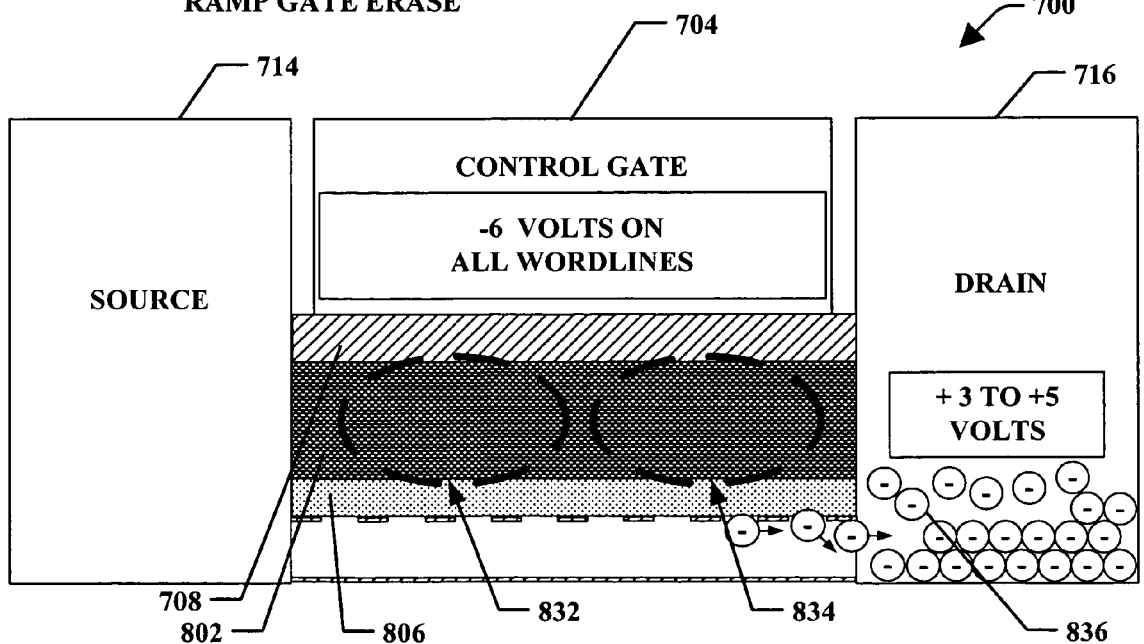
FIG. 7 is a schematic of an exemplary illustration of a prior art dual bit memory cell erasing a complementary second bit.

FIG. 7 illustrates a conventional prior art erasure method for erasing ("1") a second bit 732 of a dual bit memory cell, at 700. The memory cell 700 of a prior art system can be made up of a floating gate 702 (nitride layer) situated in between a control oxide film 708 and a tunnel oxide film 706. The charge trapping layer or floating gate 702, for example, rests upon or bonds with the oxide film 708. A polysilicon control gate 704 can be a conductive polysilicon that is connected to a wordline, as mentioned above. The dual memory cell 700 can store at least two data bits, 732 and 734 shown in FIG. 7 as two dashed ovals. The dual bit memory cell 700 is generally symmetrical, thus the drain 716 and the source 714 are interchangeable, although the memory cell 700 could be non-symmetrical, as well. Thus, the left area can serve as the transistor source 714 and the right area can serve as the transistor drain 716 with respect to the right bit 734. Likewise, the right junction may serve as the source terminal and the left junction as the drain terminal for the right bit 732. The control gate 704 can be supplied, for example, with a constant negative 6 volts by applying the voltage to an associated wordline. The drain 716 is then supplied with a constant positive 3-5 volts. The negative voltage on the control gate 704 repels electrons 736 on the floating gate 702 and the drain 714 positive voltage attracts the electrons, wherein the second bit area 734 is erased.

Various implementations of dual bit memory cell erasure may be verified according to one or more aspects of the conventional art. In particular, this description of current art is applicable to memory devices wherein both bits in the dual bit cells (e.g., 732 and 734) are used for data or information storage. The erasure verification method comprises the steps of performing a determination of whether the first bit 732 in the dual bit memory cell is properly erased, performing a first verification of whether the second bit 734 in the dual bit memory cell 700 is properly erased if the first bit 732 is properly erased, and determining that the dual bit memory cell 700 is properly erased if the first bit 732 is properly erased and if the second bit 734 is properly erased according to the first verification.

In another embodiment of the present invention, illustrated in FIG. 8, the initial control gate 804 voltage, for example, can be set to a negative four and one half volts (−4.5 volts), the step change can be set at negative eighty millivolts (−80 mV) and the drain 814 can, for example, be set initially to positive three volts (+4 volts). During the first, second and third control gate voltage pulses, the memory cell voltage arrangement comprises a negative four and one half volts (−4.5 V) at the control gate, a positive four volts (+4 volts) at the drain 816 and zero volts (0 volts) at the source (virtual ground). With each pulse a number of memory bits within a given memory sector are erased. During the forth, fifth and sixth control gate voltage pulses, the memory cell voltage arrangement comprises the control gate voltage incremented by negative eighty millivolts (−80 mV) or a negative 4.58 volts (−4.58 volts), a positive four volts (+4 volts) at the drain 816 and zero volts (0 volts) at the source (virtual ground).

In yet another embodiment of the present invention, FIG. 9 illustrates at 900, a second bit 934 that can be erased utilizing another aspect of the present invention. Rather than using a uniform incremental ramp, a memory cell 900 can employ a "non-uniform" step change. An initial control gate 904 voltage, can be regulated to, for example, a negative five volts (−5 volts), the step change can be set at negative fifty millivolts (−50 mV) for every fifth pulse and negative one hundred and fifty millivolts (−150 mV) for every twelfth pulse, wherein a drain 914 can, for example, be set initially to a positive three volts (+3 volts) and the source 914 set to zero. During the first control gate 904 voltage pulse, the memory cell 900 voltage arrangement comprises a negative five volts (−5 V) at the control gate, a positive three volts (3 volts) at the drain 916 and the source 914 held at virtual ground. With the first through the fourth pulse a number of memory bits within a given memory sector are erased during each pulse of 300 ? sec. During the fifth pulse the control gate voltage is incremented to −5.05 volts, and remains there until the tenth pulse is reached, where the voltage becomes −5.10 volts. At the twelfth pulse the voltage is set at −5.25 volts where it again remains until the fifteenth pulse.

It is to be appreciated, that although this disclosure refers to gate 916 voltages that increase incrementally in some fashion, the invention can make use of control gate 914 voltages that increase, control gate 904 voltages that decrease, control gate voltages that both increase and decrease, drain voltages that increase, drain voltages that decrease, drain voltages that both increase and decrease, source voltages that increase, source voltages that decrease, source voltages that both increase and decrease, and the like, or any combination thereof.

Verification of proper erasure of both bits, 932 and 934, in a dual bit memory cell configuration according to the method ensures that data retention and/or bit over-erase problems associated with one of the bits in the cell do not adversely affect the operation (e.g., proper erasure, read/write functionality) of the other or complementary bit. It is to be appreciated that the gate voltage can be incremented in various ways both linearly and non-linearly. In addition the gate voltage can be incremented and reduced in various ways (e.g., linearly, in a step fashion, a combination thereof, etc.) and still fall within the scope of the invention.

Figure 10:
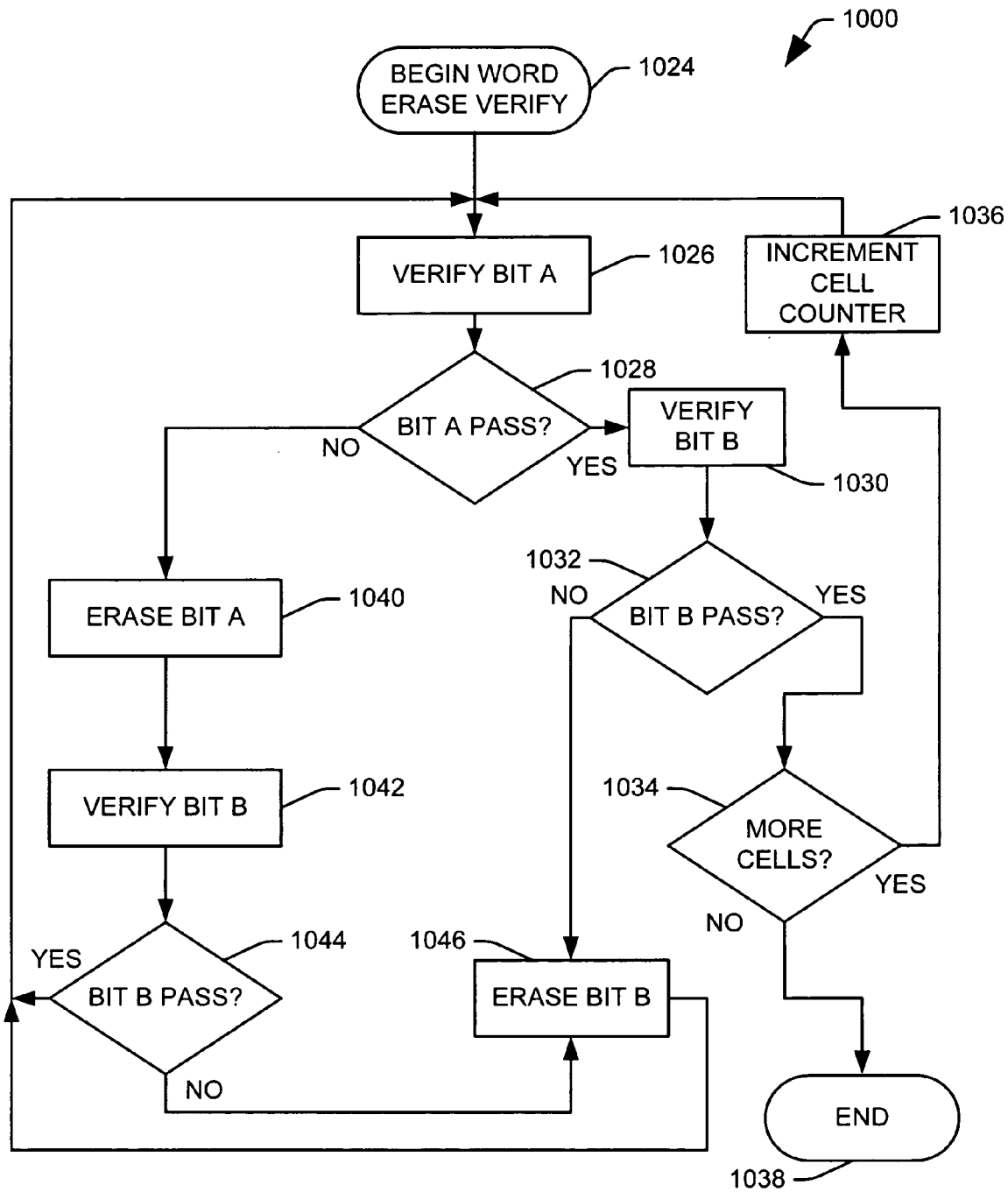
FIG. 10 is a flow diagram illustrating an prior art method of erasing a memory cell.

Illustrated in FIG. 10 is a conventional prior art erasure method for erasing ("1") at first bit 1040 of a dual bit memory cell, at 1000. Referring now to FIG. 10, a method 1000 is illustrated for memory erasure, employed in association with one or more dual bit flash memory cells as part of a sector erase operation. Once a pre-programming operation has been performed to erase the data bits of a sector of memory (e.g., by writing a 1 value thereto), the method 1000 begins at step 1024, after which the first bit of a dual bit memory cell (e.g., bit A of cell 322) is verified at step 1026. At decision step 1028, a determination is made as to whether bit A has been properly erased. When the properly erased bit in a memory cell has a lower threshold voltage than that of a programmed bit, a voltage between the programmed bit threshold voltage and that of an erased bit is applied to two terminals of the three terminal memory structure and the resulting current sensed to determine whether the bit has been properly erased.

If bit A has been properly erased at step 1028, the method 1000 proceeds to step 1030, whereat a verification is performed to verify proper erasure of a second bit in the dual bit architecture memory cell. Where it is found at decision step 1032 that the second bit B has also been properly erased, the method proceeds to step 1034, whereat it is determined whether more cells (e.g., in a multiple cell memory block or sector) need to be verified. The prior art method is selectively employed to verify erasure of a certain number of the cells or a sector which are connected in a NOR configuration.

If there are other cells to be verified at decision step 1034, the method proceeds to step 1036, whereat a cell counter (not shown) may be incremented prior to returning to step 1026. Otherwise the method ends at step 1038. The method 1000 ensures against the deleterious cross effects of data retention and/or over-erasure of one bit in a dual bit memory cell with respect to the other such bit, by verifying the proper erasure of both bits in each cell prior to moving on to the next cell at step 1036 or ending the process at step 1038.

Referring again to step 1028, if bit A in the cell has not been properly erased the method 1000 proceeds to step 1040 whereat bit A or the first bit is erased (via the application of an erase pulse to two terminals of the cell as illustrated and described in greater detail hereinafter). At this point, the proper erasure of bit A is again be verified. However, the repeated application of erase pulses to bit A may cause over-erasure of bit B or the second bit. In order to ensure against such an over-erased condition in bit B, the method 1000 verifies proper erasure of bit B at step 1042 following application of an erase pulse to bit A at step 1042.

In this manner, bit B will not be subjected to repeated erase pulses on bit A (and the residual effect thereof on bit B) without being itself verified after each application thereof to bit A. A decision is accordingly made at step 1044 as to whether bit B (e.g., the second bit in the dual bit memory cell) has been properly erased. If so, the method 1000 returns to step 1026 for a re-verification of the proper erasure of bit A as described above. Otherwise (bit B is not properly erased), method 1000 proceeds to step 1046 whereat bit B is again erased (e.g., via application of an erase pulse to the cell) before returning to step 1026. It will be noted in this regard, that following application of erase pulses to bit B at step 1046, bit A is verified immediately thereafter at step 1026. This methodology thus prevents repeated application of erase pulses to bit B (and the residual effect thereof on bit A) without bit A being verified after each application thereof to bit B. The method 1000 thereby reduces the likelihood of over-erasure of the bits A and B caused during the erase verification.

Further in accordance with the prior art method 1000, if it is determined at step 1032 that bit B has not been properly erased (e.g., as verified at step 1030 following a determination at step 1028 that bit A is properly erased), bit B is erased at step 1046, after which the method 1000 returns to step 1026. Thus, the method 1000 selectively verifies, re-verifies, erases, and re-erases one or both bits (e.g., bit A and bit B) of a dual bit memory cell in order to ensure that both bits are properly erased (e.g., at step 1032) prior to ending at step 1038 or proceeding to another such cell at step 1036

Figure 11:
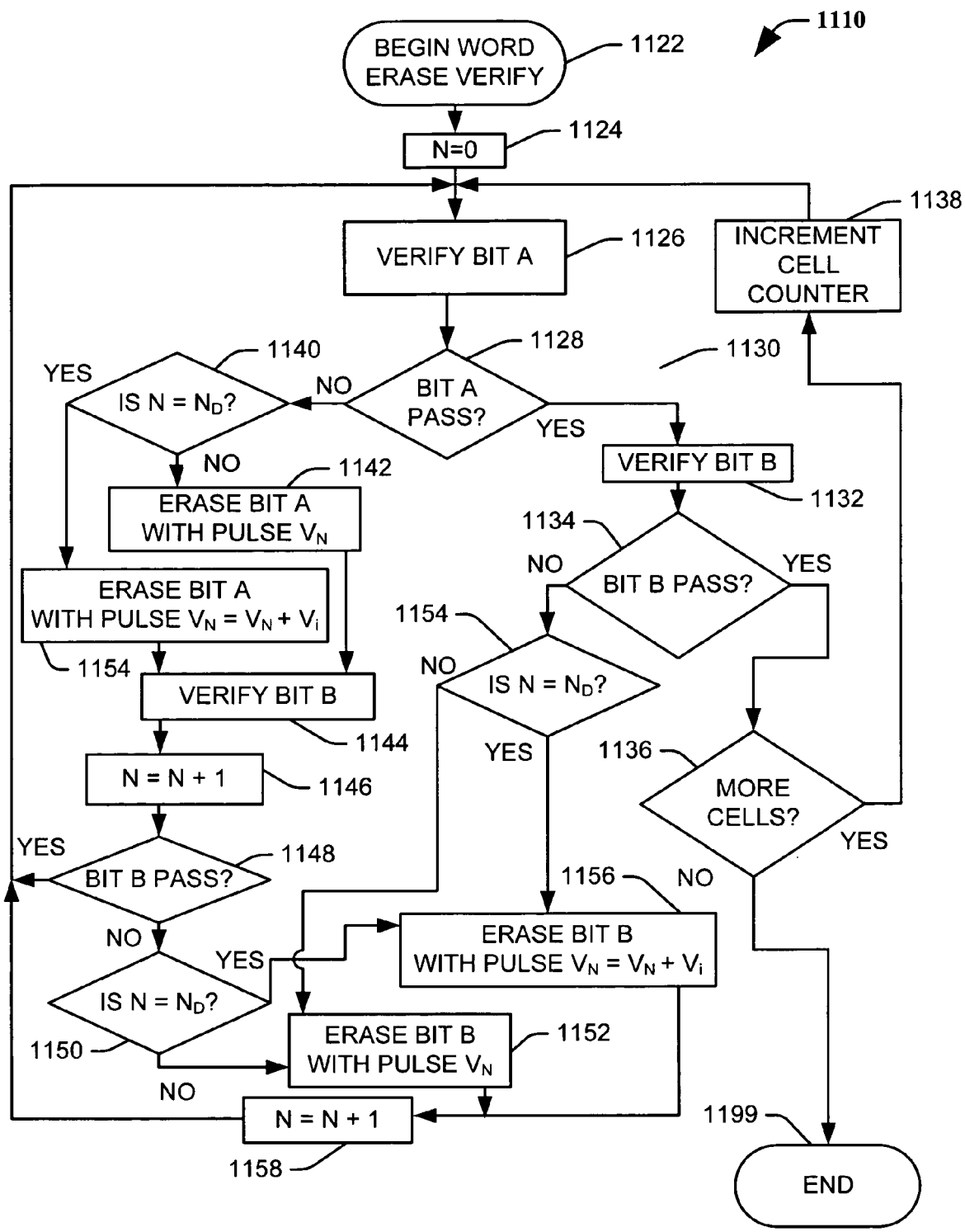
FIG. 11 is an illustration of a flow diagram employing an exemplary ramped gate voltage erasure technique, according to yet another aspect of the present invention.

Illustrated in FIG. 11 is an exemplary erasure method for erasing ("1") at first bit of a dual bit memory cell, at 1100, according to one or more aspects of the present invention. Referring now to FIG. 11, an exemplary method 1100 is illustrated for memory erasure, which may be advantageously employed in association with one or more dual bit flash memory cells (e.g., cell 322 of FIG. 3), for example, as part of a sector erase operation. For example, once a pre-programming operation has been performed to erase the data bits of a sector of memory (e.g., by writing a 1 value thereto), the method 1100 begins at step 1122 where N is set equal to zero. N is an integer that represents the number of times that a cell is pulsed at a given voltage. In this example, N is selected to equal three, in other words, the cell will be pulsed at a given voltage VN, three times before it is incremented to a higher voltage (VN=VN+Vi) where Vi is the chosen incremental voltage. After N is set equal to zero, the first bit of a dual bit memory cell (e.g., bit A of cell 322) is verified at step 1124. At decision step 1126, a determination is made as to whether bit A has been properly erased. As illustrated and described in greater detail hereinafter the erasure verification operations performed at steps 1128, 1132, and 1144, of the method 1000, may be carried out via the application of a voltage to the cell and the sensing of a current in the cell. For example, where a properly erased bit in a memory cell has a lower threshold voltage than that of a programmed bit, an appropriate voltage between the programmed bit threshold voltage and that of an erased bit may be applied to two terminals of the three terminal memory structure (e.g., dual bit memory cell 322 of FIG. 3), and the resulting current may be sensed to determine whether the bit has been properly erased.

If bit A has been properly erased at step 1126, the method 1100 proceeds to step 1130, whereat a verification integer N is incremented by one. A verification of bit B is performed at 1132 to verify proper erasure of a second bit in the dual bit architecture memory cell. As in method 1000 only one bit (e.g., the first bit) in the dual bit memory cell is used for data storage in the following discussion. However, it will be appreciated that the method may be advantageously employed in association with dual bit memory cells wherein both bits are used for data storage. In addition, it will be appreciated that the selective verification of both bits in such a dual bit cell accounts for the possibility of data retention and over-erase conditions in one such bit affecting the operation of the other such bit, and accordingly provides for selective verification and re-erasure of such bits, in order to eliminate or minimize the cross effects of such phenomena.

Where it is found at decision step 1134 that the second bit B has also been properly erased, the method proceeds to step 1136, whereat it is determined whether more cells (e.g., in a multiple cell memory block or sector) need to be verified. For example, the method may be selectively employed to verify erasure of a certain number of the cells (e.g., eight or sixteen), or a sector which are connected in a NOR configuration, although other implementations are possible wherein any number of such cells may be serially verified according to the invention.

If there are other cells to be verified at decision step 1136, the method proceeds to step 1038, whereat a cell counter (not shown) may be incremented prior to returning to step 1126. Otherwise (e.g., all such cells have been verified), the method ends at step 1038. At this point it will be noted that the method 1000 ensures against the deleterious cross effects of data retention and/or over-erasure of one bit in a dual bit memory cell with respect to the other such bit, by verifying the proper erasure of both bits in each cell prior to moving on to the next cell at step 1126 or ending the process at step 1199.

Referring again to step 1126, if bit A in the cell has not been properly erased (e.g., as determined via the bit A verification at step 1128), the method 1100 proceeds to verification step 1140. At step 1140 if it is determined that N, the integer, is not equal to ND, the defined number of pulses at a given voltage, the method 1100 proceeds to step 1142 whereat bit A is erased (e.g., via the application of an erase pulse to two terminals of the cell as illustrated and described in greater detail hereinafter) with a gate voltage pulse equal to VN, in this case, for example, minus six volts (−6V). At this point, the proper erasure of bit A could again be verified. However, the inventors of the present invention have found that deleterious consequences may result from the potential repeated erasure and verification of bit A. For instance, the repeated application of erase pulses to bit A may cause over-erasure of bit B or the second bit. In order to ensure against such an over-erased condition in bit B, the method 1100 verifies proper erasure of bit B at step 1144 following application of an erase pulse to bit A at step 1142.

In this manner, bit B will not be subjected to repeated erase pulses on bit A (and the residual effect thereof on bit B) without being itself verified after each application thereof to bit A. At step 1146 the integer N is increased by one. A decision is accordingly made at step 1148 as to whether bit B (e.g., the second bit in the dual bit memory cell) has been properly erased. If so, the method 1100 returns to step 1126 for a re-verification of the proper erasure of bit A as described above. Otherwise (bit B is not properly erased), method 1100 proceeds to step 1152 whereat bit B is again erased (e.g., via application of an erase pulse to the cell) before returning to step 1126. It will be noted in this regard, that following application of erase pulses to bit B at step 1152, bit A is verified immediately thereafter at step 1126. This methodology thus prevents repeated application of erase pulses to bit B (and the residual effect thereof on bit A) without bit A being verified after each application thereof to bit B. The method 1100 thereby reduces the likelihood of over-erasure of the bits A and B caused during the erase verification.

Further in accordance with an aspect of the present invention with respect to method 1100, if it is determined at step 1140 that the integer N is equal to the defined number of pulses ND than the method 1100 proceeds to step 1154. At step 1154 an incremented voltage pulse, for example, −6.015 volts (equal to VN+Vi, or −6 volts −0.015 volts) is applied to bit A. At 1144, bit B is verified to determine if it was properly erased, as mentioned above, the method 1100 can take the previously described path.

Further in accordance with the method 1100, if it is determined at step 1134 that bit B has not been properly erased (e.g., as verified at step 1132 following a determination at step 1128 that bit A is properly erased), than another determination is made whether N is equal to ND. If the integer N (the number of voltage pulses at a given voltage) is equal to ND, the defined number of pulses at a given voltage, the method 1100 proceeds to step 1142 whereat bit B is erased utilizing an erase voltage pulse equal to VN plus Vi or the previous voltage plus an incremental voltage. The method 1100 then increments the integer N by one, otherwise if the integer N is not equal to ND at step 1154, the method 1100 proceeds to step 1152. Bit B is erased at step 1152 employing a erase voltage pulse of VN, after which the method 1100 proceeds to step 1158 and increments N by one before returning to step 1126. Thus, the method 1100 selectively verifies, re-verifies, erases, and re-erases one or both bits (e.g., bit A and bit B) of a dual bit memory cell in order to ensure that both bits are properly erased (e.g., at step 1132) prior to ending at step 1199 or proceeding to another such cell at step 1126. It is to be appreciated, that the verification steps and/or methods used to determine if bits are properly erased, discussed herein, are well known by those skilled in the art.

It will be appreciated in this regard, that the method 1100 may include internal counters or other steps by which a cell may be determined to be unusable (e.g., unable to be properly erased) after a number of unsuccessful attempts at erasure/verification, whereby the cell (e.g., or a number of related cells, such as a byte or word) may be marked as bad, or the part itself may hang as part of a failed sector erase operation. Further in this regard, if the method 1100 is employed in a manufacturing process (e.g., before or after packaging, but before shipment to a customer), redundancy may be employed to mark a cell or a number of cells as bad, and to provide alternate or redundant storage cells as a replacement, whereby acceptable manufacturing yield may be achieved. The method 1100 may also be employed in association with a sector or chip erase operation initiated by an end-user, wherein a cell failure may be indicated to the user via the memory device hanging as a result. It will also be appreciated that the gate voltage pulse can be incremented in various ways, for example, linearly, non-linearly, based on a function f(x)=x2, a step function, and the like.

Figure 12:
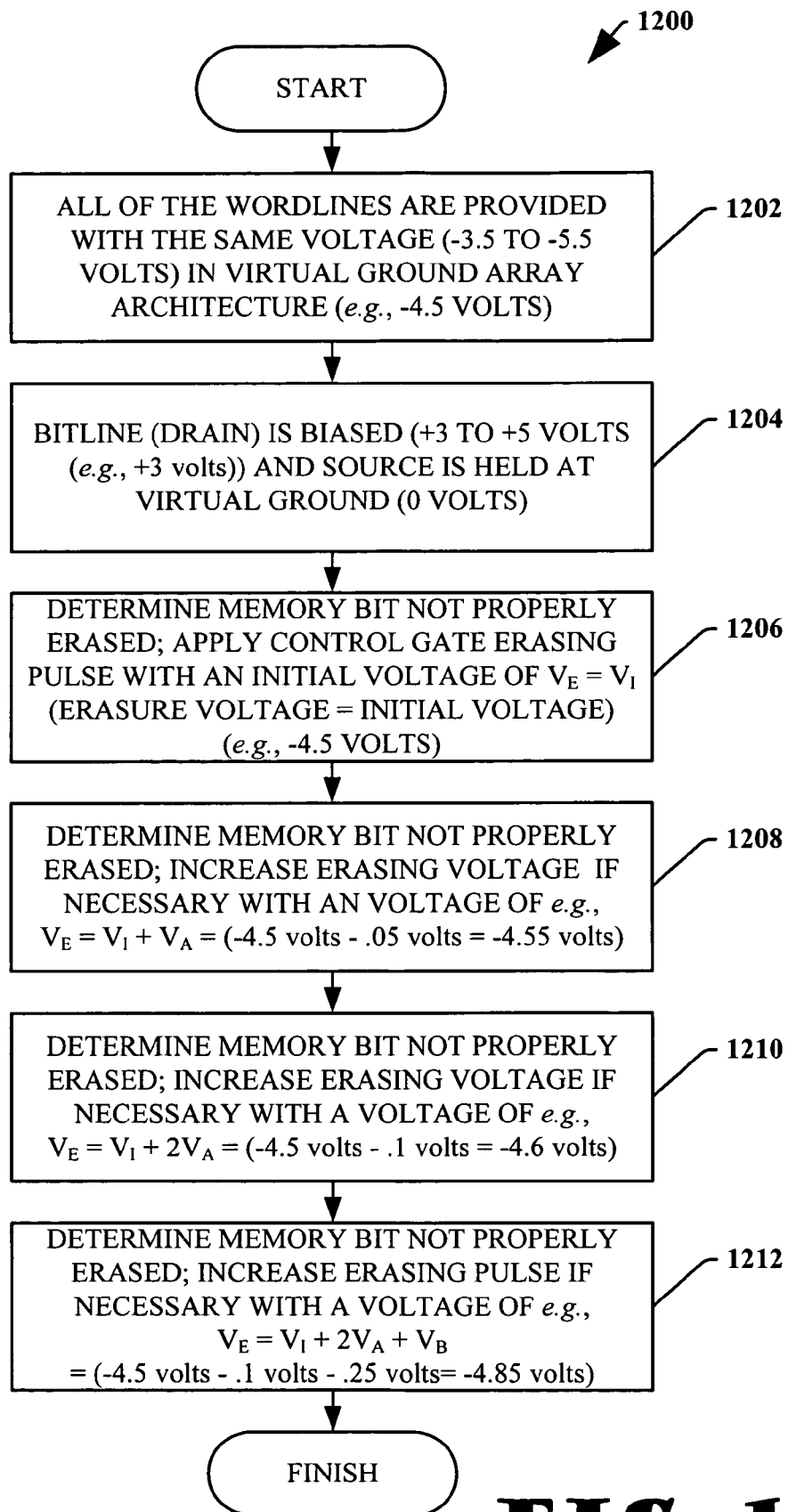
FIG. 12 is a flow chart illustrating an exemplary ramped gate voltage erase technique, according to yet another aspect of the present invention.
Figure 13:
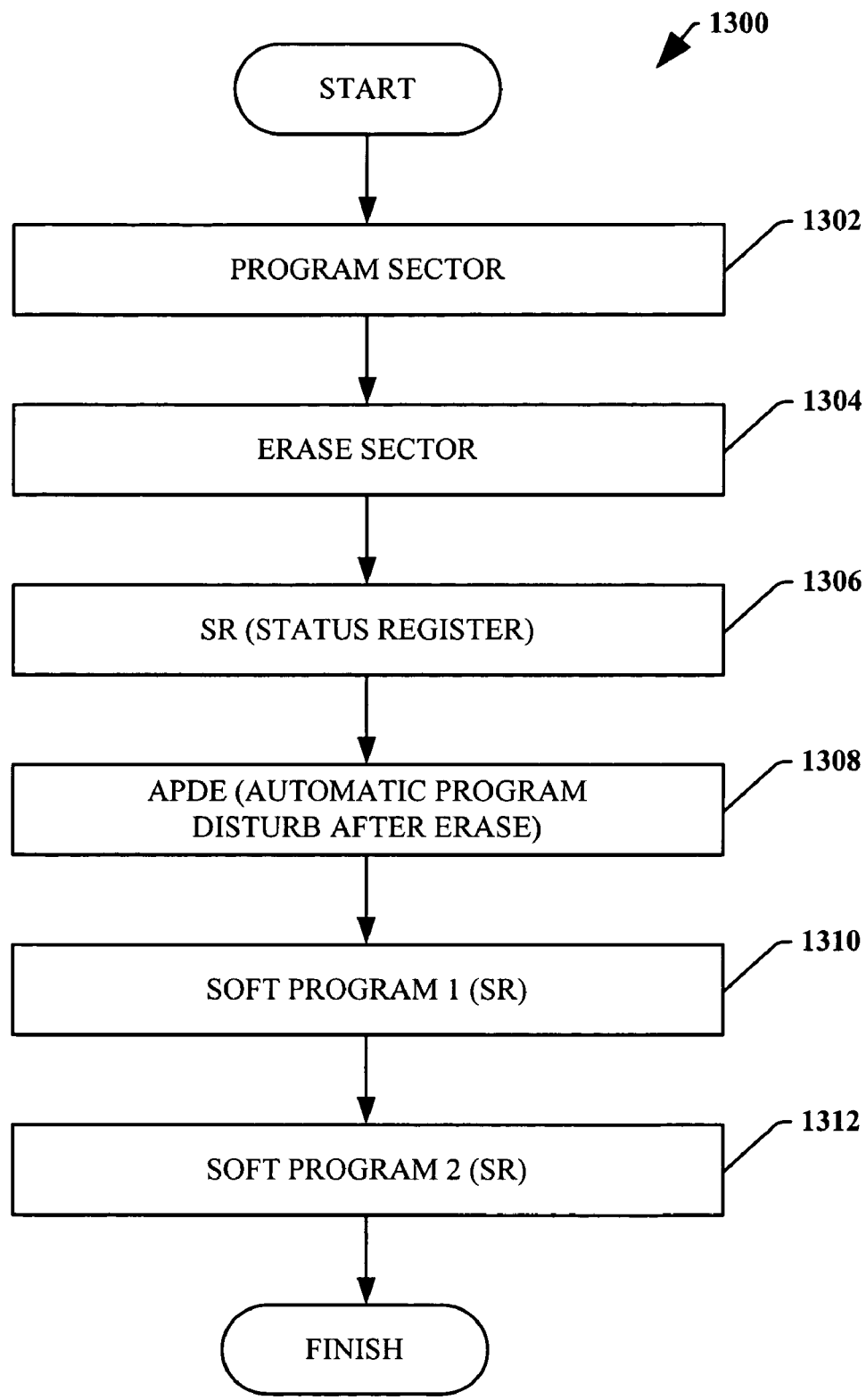
FIG. 13 is a flow chart illustrating an exemplary ramped gate voltage erase technique, according to yet another aspect of the present invention.

As alluded to above, the ramped source gate erase contemplates a lower number of erase pulses, a lower power, lower current and reduced time erase methodology. Turning to FIGS. 12 and 13, methodologies 1300 and 1400, respectively are illustrated that facilitate erasing bits of dual bit memory cells. It will be appreciated that although the methodologies 1200 and 1300 are illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Furthermore, one or more of the acts may be carried out in one or more separate acts or phases.

As indicated, the methodologies illustrated herein utilize a predetermined "checkerboard pattern" of drain voltage levels that is applied to the word or word grouping of complimentary bit cells in several passes to store a target pattern in the word and erase the bits of the cell utilizing a ramp voltage control gate. The methodologies of the present invention are suited for cells selected from a single word line; however, other strategies in accordance with the method are also anticipated.

FIG. 12 is a flow chart diagram illustrating an exemplary method 1200 of erasing flash memory bits whether the memory is single bit, dual bit or multi-bit memory cells by employing ramped control gate voltages in accordance with one or more embodiments of the present invention. FIG. 12 will be described in conjunction with FIG. 3 and FIG. 5 in order to facilitate an understanding of this embodiment. The methodology will discuss the erasure of only one bit utilizing a single non uniform step, however the methodology with slight modification would work equally well for dual bit or multi-bit applications with multiple non uniform steps.

The method begins at step 1202, wherein all wordlines within the selected memory sector are provided with the same negative voltage that can range, for example, from −3.5 to −5 volts in virtual ground array architecture. For example, all of the wordlines can be set to −4.5 volts (e.g., WORDLINE1-WORDLINE5, in FIG. 3), and therefore all of the associated control gates 304 are set to −4.5 volts. Setting only wordline 322 to −4.5 volts, in contrast, sets only the control gate 322 and all control gates on the wordline 322 to −4.5 volts, as illustrated in FIG. 3.

The method continues at 1204, wherein every other bitline in the memory sector, can be, for example, biased at a positive three to positive five volts (+3 to +5 volts). For example, every other bitline (e.g., bitline 320) can be set to a positive three volts (+3 volts), wherein the other bitlines are allowed to float in virtual ground architecture. At step 1206 if, for example, it was determined that the first bit of cell 324 was not properly erased, an erasing pulse of e.g., 300 ? sec with an erasing voltage (VE) equal to an initial voltage of negative four and one half (VI=−4.5 volts) would be applied to control gate 304. A voltage of positive three volts (+3 volts) can be applied to drain 314, wherein source 316 connected to virtual ground can be set at zero volts (0 V) or virtual ground.

At 1208, a determination is again made as to the level of the "erased" bit 324, whether it is less than or equal to a predetermined threshold voltage (Vt). If the level of bit 324 is less than or equal to the predetermined Vt at 1208, the method 1200 ends at 1208. It will be appreciated that the determination of such bit levels, for example, can involve reading the bit currents of the cell as discussed supra, and the like, and that reading such currents as referenced herein generally means reading drain 316 to source 314 currents (Ids).

Otherwise, if the bit 322 of, for example, of a bit-pair is greater than the predetermined Vt at 1208, the erase methodology continues wherein an erasing pulse of 300 ? sec is applied to the first bit of memory cell 324 employing an increased or ramped erase voltage (VE). The erase voltage can be incremented by voltage A, e.g., negative fifty millivolts (VA=−50 mV) to equal −4.55 volts (VE=VI+VA). The drain voltage (VD) and source voltage (VS) can remain at positive three volts (+3 volts) and zero volts (0 volts), respectively.

Thereafter, at 1210 the erase methodology may yet again make a determination of the erase level for the first bit of the cell 322 as indicated above, wherein it may be subsequently determined that the previous erase performed in multiple passes is now complete and the method ends. For example, after the determination is made that the first bit of the cell 322 is below a predetermined voltage threshold the method regarding the first bit can be ended ensuring that the first bit of cell 322 is not over erased. If the first bit has not been properly erased at 1210 the erase voltage can again be increased, for example, by another incremental voltage A (VA), or in mathematical terms: VE=VI+2VA.

Subsequently, at method step 1212 the erasure method applied to the first bit of the cell 322 again makes a inquiry as to the erase level as previously indicated, whereat it may be discovered that the prior erasure carried out in the multiple erase passes is now satisfactory and the methodology ends. For example, it is discovered that the first bit of the cell 322 is determined properly erased and further erasures are not necessary the method can be ended preventing an over-erasure condition of the first bit. A determination that the first bit of cell 324 has not been suitably erased at 1210 the erase voltage can again be increased, for example, by another incremental voltage B (VB) that is different than voltage A (VA), or in mathematical terms: VE=VI+2VA+VB. For example, voltage B can be set to two hundred and fifty millivolts (250 mV). This, for example, would result in a new erasure voltage (VE), equal to −4.5V+2(−0.05V)+(−0.25V) or −4.85 volts.

Although the method described above is an efficient method discussed herein, alternately, any pattern of ramped control gate voltage can be employed with some steps of the invention and erasure can be performed utilizing a common associated erase pattern. Finally, individual cells may be erased according to the method. Other such bit and cell grouping arrangements are anticipated in accordance with the method of the present invention.

FIG. 13 is a flow chart diagram 1300 that illustrates various modes in which the dual bit memory sector array of FIG. 3 may reside according to one embodiment of the present invention. For example, initially the memory cell 322 may reside within the program sector mode 1302 of the partial sector array of wordlines and bitlines of flash memory cells. At 1302 the sector array of first and second bits of a dual bit memory cell (e.g., flash memory cell 324) are programmed in order to prevent the cells from becoming over-erased with cycling. This step 1302 is often referred to as preconditioning and is well know by those skilled in the art.

At 1304 a sector of memory cells can be erased. It will be appreciated at this point, that the method 1300 may be included within a multiple cell erasure verification routine or method in which memory cell erasure may be verified in method 1300 via step 1304. After the erase operation at step 1304, storage of additional information at the status register step 1306 is executed which compares and verifies whether an erasure has been completed successfully. At method step 1308, an automatic program disturb after erase (APDE) is performed. Programming a flash memory cell typically involves high voltage stresses as high voltage is applied to other cells that share the same wordline or bitline with the cell 322 to be programmed. These other cells can be affected by this stress and the charge stored in these cells can be altered. The automatic program disturb after erase test at 1308 is performed to see if cells that are not intentionally being programmed ("0") or erased ("1") are influenced by the high voltage being applied to the targeted cell. In general, a single cell is employed to monitor the disturb effect and the simulated program pulse is applied to a test cell at step 1308 and the threshold voltage shift is monitored. After step 1308, any cells with very low threshold voltages (Vt) are "soft programmed" back into the main erase cell distribution. This can suppress column leakage during subsequent programming or read operations which may result in memory cell failure. This is often referred to as postconditioning of post erase repair (PER). In this fashion, the cross-effects (e.g., over-erasure and/or data retention) between two bits in a dual bit memory cell may be accounted for and minimized, for example, by ensuring that the cell is not passed through erasure verification until both bits therein are properly erased.

Figure 14:
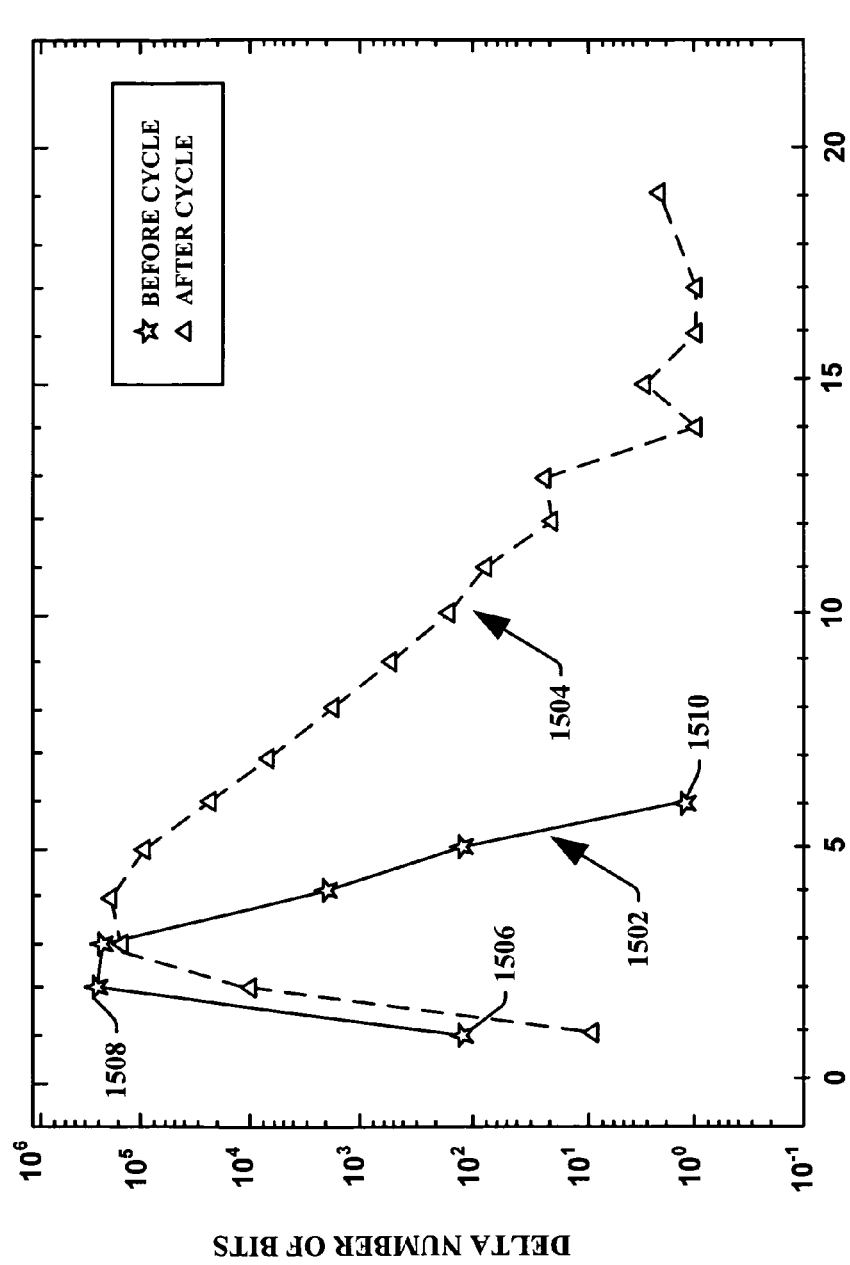
FIG. 14 is a graph of the number of bits erased per erasure pulses, in accordance with an aspect of the present invention.

Referring now to FIG. 14, is a graph illustrating the number of pulse widths necessary to erase a cell sector, both before and after the cell sector has been exposed to one thousand (1000) erasure cycles. A typical endurance test is performed to evaluate the durability of flash memory cells and/or devices, wherein program and erase pulses are alternately and continuously applied to e.g., the cell sector. The number of erased bits is then determined after applying a specified number of pulses, for example, after 1 pulse, 10 pulses, 100 pulses, 1000 pulses, 10,000 pulses, and the like.

The PRIOR ART chart in FIG. 14 illustrates the number of erase pulses (e.g., at 300 ?sec) seen by bits, of a memory sector, as plotted on the linear x-axis, while the number of bits that are erased in the sector is plotted on the logarithmic scale, y-axis. The graph 1400 includes two different exemplary groupings of curves 1402 and 1404 corresponding to the before and after condition of conditioning the memory sector, one thousand erasure cycles. First curve 1402 illustrates the erase rate distribution curve based upon applying a constant voltage, of constant duration (e.g., 300 ?sec) to the control gate 304, and plotting the number of bits erased vs. the number of erase pulses applied. The curve 1402 illustrates the erase rate distribution of the memory sector prior to the one thousand (1000) cycle endurance test. The second curve 1404 illustrates the erase rate distribution of the same memory sector after the one thousand (1000) cycle endurance test has been completed. Graph 1400 clearly illustrates several problems associated with the prior art, discussed supra. First, curve 1402 indicates that after the sixth erase pulse at 1406 almost all of the memory sector bits have been erased. However, after the endurance test of one thousand erasure cycles, it is evident that the number of erasure pulses to erase almost all of the memory sector bits has increased to nearly twenty pulses. It is apparent in the graph that the leading edges of the two curves are similar; however the trailing edges of the two curves are quite different. The increase in the number of pulses, in the trailing edge, for curve 1404 can result in several disadvantages, for example, slower erasure times, increased erasure power required, and the like.

The PRIOR ART as illustrated in the graph 1402, at 1406, one 300 ?sec erase pulse can erase approximately 102 or 100 bits of data and at 1404, two pulses can erase a substantially higher number of bits, approximately $1.2 \times 10^5$ or 120,000 bits of data. Three erase pulses at 1410 can erase approximately the same number of bits as the two pulses achieved, approximately $1.15 \times 10^5$ or 115,000 bits of data. As illustrated in the first chart nearly all of the data in the memory cell is erased after the sixth erase pulse, as verified by employing a verification technique, known by those skilled in the art.

The memory cell was then subjected to a 1000 cycle endurance test, whereat the memory cell was subjected to programming and erase pulses that are continually applied to the cell. The memory cell is then re-conditioned and the erasure data is again plotted vs. the number of pulses. Note that in the second chart 1404 compared to the first chart 1404 that there is a significant difference seen at the tail of curve 1404 for field reduction due to the thousand (1000) cycle test.

Referring to FIG. 15, in one embodiment of the present invention, is a graph at 1500 that illustrates representative erasure data that was obtained, comparing two ramped gate voltage curves and a fixed gate voltage curve. The graph illustrates the number of cycles necessary to erase an entire memory sector, as plotted on a logarithmic x-axis, while the total number of pulses required to erase the sector is plotted on a linear scale, y-axis. The graph 1500 includes three different exemplary groupings of curves 1502, 1504 and 1506 corresponding to differing voltages, for example, gate voltage, drain voltage and ramp voltage. The first curve 1502 was obtained by fixing the control gate voltage at negative six volts (−6V), the drain at a constant positive six volts (+6V) and the source set to zero volts (0V). The second curve 1504 is representative data plotted based on an initial gate voltage of negative three volts (−3V), a drain voltage of positive six volts (+6V), and a gate voltage step of −0.3 volts. The third curve 1506 represents data plotted on the curve, based on an initial gate voltage of negative six volts (−6V), a drain voltage of positive six volts (+6V), and a gate voltage step of −0.15 volts.

For example, it can be seen in the curve 1502, wherein the gate voltage is constant that initially it requires between six and seven pulses at 1508, to completely erase the memory sector. Also it is apparent that up to approximately two hundred (200) erasure cycles the number of pulses required to fully erase the sector is eleven or less, however at greater than two hundred cycles the rate of change of the number of pulses vs. the number of cycles increases rapidly and prior to one thousand cycles is exponential. At 1512 or approximately four hundred cycles both the curve 1502 (fixed gate) and the curve 1504 (ramped gate, −0.3 volt step) require between approximately fifteen and sixteen pulses. For example, from point 1512 onward the fixed gate voltage design requires a much larger number of pulses to erase the memory sector.

Curve 1504 indicates that initially a first ramped gate design requires approximately ten pulses on the control gate of negative six volts with the drain held at a constant positive six volts. In the first ramped gate design the gate voltage was incremented after three cycles. In other words, the gate voltage for cycles one (C1) was negative 3.0 volts, cycles two (C2) was −3.0003 volts; cycle three (C3) was −3.0006 volts, and so on. At ten thousand cycles, the gate voltage reaches approximately −8.7 volts and requires approximately twenty one pulses in order to erase the sector at 1514.

In yet another test, a second ramped gate voltage curve 1506 was obtained by employing an initial gate voltage of negative three volts (−3 V), and a step voltage of −0.15 millivolts. Similarly to the first ramped gate curve 1504, the second ramped gate curve 1506 becomes linear at approximately nine cycles and reaches a gate voltage of approximately negative eight volts (−8 V) at 10,000 cycles, wherein the second ramped gate design at 1516 requires approximately thirty four (34) pulses to fully erase the memory sector.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of erasing a sector of memory cells in a flash memory cell sector array, the method comprising:
    setting a bit verify value to correspond to a predetermined threshold voltage;
    selecting a predetermined erasing profile of gate voltages for erasing non-erased bits based on an erase pattern;
    setting drain and source voltages to constant values;
    applying an erasing pulse to the bits according to the erasing profile;
    reapplying the erasing pulses to the bits according to the erasing profile until the threshold voltage of each of the bits of the sector of memory cells generally corresponds to the threshold voltage of the bit verify value; and
    deselecting the erased sector of memory cells.

2. The method of claim 1, wherein the predetermined erasing profile comprises a predetermined pattern of ramped gate voltages that are applied to the bits over successive erasing pulses.

3. The method of claim 2, wherein the gate voltage comprises a range of negative 8.5 volts to negative 1 volts.

4. The method of claim 3, wherein the predetermined erasing pattern comprises erasing gate voltages that change by about zero millivolts to about three hundred millivolts per pulse.

5. The method of claim 4, wherein the gate voltage comprises a range of negative 8.5 volts to eight volts.

6. The method of claim 4, wherein the predetermine erasing pattern comprises erasing pulses of about 300 μsec.

7. The method of claim 3, wherein all of the cell bit-pairs have the same erase patterns.

8. The method of claim 4, wherein not all of the cell bit-pairs have the same erase patterns.

9. The method of claim 2, wherein one of the drain voltage and the source voltage are held constant while the gate voltage follows the erasing profile.

10. The method of claim 2, wherein the drain voltage and the gate voltage follow the erasing profile.

11. A methodology of erasing a block of flash memory cells in a dual bit flash memory array, the methodology comprising:
    performing an erase verify of a first bit in a non-erased block of memory cells;
    if the first bit does not verify as erase, determining if the number of intervals is equal to the predetermined number of intervals;
    if the number of intervals is equal to the predetermined number of intervals, an erase pulse is applied to the first bit with a gate voltage equal to the previous gate voltage;
    if the number of intervals is not equal to the predetermined number of intervals, an erase pulse is applied to the first bit with a gate voltage equal to the previous gate voltage plus an predefined incremental voltage;
    repeating the same procedure for the second bit; and
    verifying if the memory cell is erased.

12. The methodology of claim 11 further comprising if the block of memory cells is not erased repeating the entire procedure until the block of memory cells is erased; and removing that block of memory cells from further erase iterations.

13. The methodology of claim 11, wherein the incremental voltage is a constant value, or a variable, or both.

14. The methodology of claim 11, wherein the incremental voltage is a plurality of constant values, or a plurality of variables, or both.

15. The methodology of claim 11, wherein the incremental voltage can be selected by employing predictive analysis to determine the optimum incremental voltage to erase the block of memory cells.

* * * * *